United States Patent
Fukui et al.

(10) Patent No.: US 11,670,498 B2
(45) Date of Patent: Jun. 6, 2023

(54) SURFACE TREATMENT AGENT AND SURFACE-TREATED BODY MANUFACTURING METHOD

(71) Applicant: CENTRAL GLASS COMPANY, LIMITED, Ube (JP)

(72) Inventors: Yuki Fukui, Ube (JP); Yuzo Okumura, Ube (JP); Yoshiharu Terui, Ube (JP); Soichi Kumon, Matsusaka (JP)

(73) Assignee: CENTRAL GLASS COMPANY, LIMITED, Yamaguchi (JP)

( * ) Notice: Subject to any disclaimer, the term of this patent is extended or adjusted under 35 U.S.C. 154(b) by 379 days.

(21) Appl. No.: 16/772,024

(22) PCT Filed: Dec. 14, 2018

(86) PCT No.: PCT/JP2018/046146
§ 371 (c)(1),
(2) Date: Jun. 11, 2020

(87) PCT Pub. No.: WO2019/124264
PCT Pub. Date: Jun. 27, 2019

(65) Prior Publication Data
US 2021/0090881 A1    Mar. 25, 2021

(30) Foreign Application Priority Data

Dec. 22, 2017  (JP) .............. JP2017-245661
Sep. 3, 2018   (JP) .............. JP2018-164199
Dec. 6, 2018   (JP) .............. JP2018-228940

(51) Int. Cl.
| | |
|---|---|
| *H01L 21/02* | (2006.01) |
| *B08B 3/08* | (2006.01) |
| *C09D 5/00* | (2006.01) |
| *G03F 7/16* | (2006.01) |
| *C08K 5/3445* | (2006.01) |
| *C08K 3/34* | (2006.01) |
| *C08K 5/3467* | (2006.01) |
| *C08K 5/29* | (2006.01) |
| *C08K 5/3472* | (2006.01) |
| *C08K 5/16* | (2006.01) |
| *C08K 5/3442* | (2006.01) |
| *C08K 5/34* | (2006.01) |
| *C08K 5/5419* | (2006.01) |
| *C08K 5/5445* | (2006.01) |
| *C08K 5/5465* | (2006.01) |

(52) U.S. Cl.
CPC .......... *H01L 21/02057* (2013.01); *B08B 3/08* (2013.01); *C08K 3/34* (2013.01); *C08K 5/16* (2013.01); *C08K 5/29* (2013.01); *C08K 5/34* (2013.01); *C08K 5/3442* (2013.01); *C08K 5/3445* (2013.01); *C08K 5/3467* (2013.01); *C08K 5/3472* (2013.01); *C08K 5/5419* (2013.01); *C08K 5/5445* (2021.01); *C08K 5/5465* (2013.01); *C09D 5/00* (2013.01); *G03F 7/16* (2013.01); *C09D 5/008* (2013.01); *Y10S 438/976* (2013.01)

(58) Field of Classification Search
CPC .. C08K 5/5445; C08K 5/5419; C08K 5/3442; C08K 5/5465; C08K 5/3472; C08K 5/29; H01L 21/0273; C09D 183/00
See application file for complete search history.

(56) References Cited

U.S. PATENT DOCUMENTS

| | | | |
|---|---|---|---|
| 2011/0054184 A1* | 3/2011 | Yoshida | .............. H01L 21/3105 |
| | | | 252/182.3 |
| 2017/0088722 A1 | 3/2017 | Mori et al. | |
| 2019/0341246 A1 | 11/2019 | Okumura et al. | |

FOREIGN PATENT DOCUMENTS

| | | |
|---|---|---|
| JP | 2011-049468 | 3/2011 |
| JP | 2017-063179 | 3/2017 |

(Continued)

OTHER PUBLICATIONS

First Office Action dated Jun. 28, 2019 in the corresponding Taiwanese application No. 107146310, 7 pges.

(Continued)

*Primary Examiner* — Kuo Liang Peng
(74) *Attorney, Agent, or Firm* — Hamre, Schumann, Mueller & Larson, P.C.

(57) ABSTRACT

According to the present disclosure, there are provided a surface treatment agent having the advantage that the raw material components can be dissolved in a short time during preparation of the surface treatment agent and capable of exerting a good water repellency imparting effect, and a method of manufacturing a surface-treated body with the use of the surface treatment agent. The surface treatment agent according to the present disclosure includes the following components: (I) at least one kind selected from the group consisting of silicon compounds represented by the following general formulas [1], [2] and [3]; (II) at least one kind selected from the group consisting of a nitrogen-containing heterocyclic compound represented by the following general formula [4], a nitrogen-containing heterocyclic compound represented by the following general formula [5], and imidazole; and (III) an organic solvent.

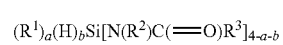

[1]

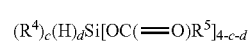

[2]

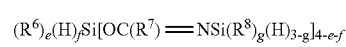

[3]

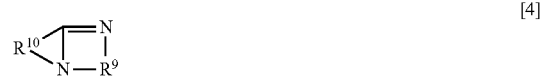

[4]

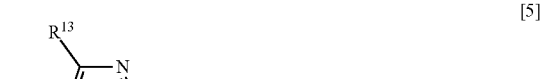

[5]

20 Claims, 3 Drawing Sheets

(56) References Cited

FOREIGN PATENT DOCUMENTS

| | | |
|---|---|---|
| JP | 2018-137426 | 8/2018 |
| TW | 201726905 | 8/2017 |

OTHER PUBLICATIONS

Second Office Action dated Oct. 31, 2019 in the corresponding Taiwanese application No. 107146310, 5 pages.
International Search Report of PCT/JP2018/046146, dated Mar. 5, 2019, 4 pages including English translation.

* cited by examiner

SURFACE TREATMENT AGENT AND SURFACE-TREATED BODY MANUFACTURING METHOD

FIELD OF THE INVENTION

The present disclosure relates to a surface treatment agent, and a method of manufacturing a surface-treated body. More particularly, the present disclosure relates to a surface treatment agent suitably usable for surface treatment of a workpiece such as a substrate for manufacturing of a semiconductor integrated circuit, and a method of manufacturing a surface-treated body.

BACKGROUND ART

In the manufacturing of semiconductor devices, it is common practice to use a lithographic technique before performing processing such as etching on substrates. In the lithographic technique, a resin pattern is provided on a substrate by forming a photosensitive resin layer from a photosensitive resin composition on the substrate, selectively exposing the photosensitive resin layer to active radiation, developing the exposed photosensitive resin layer and selectively dissolving and removing the developed photosensitive resin layer. Then, an inorganic pattern is formed on the surface by an etching process with the use of the resin patterns as a mask.

With the recent increasing tendency toward the high integration and miniaturization of semiconductor devices, the resin pattern used as the mask and the inorganic pattern formed by the etching process are being made finer and higher in aspect ratio. On the other hand, the occurrence of a so-called pattern collapse is becoming a problem. The pattern collapse is a phenomenon that, when a plurality of resin pattern traces or inorganic pattern traces are formed side by side on a substrate, adjacent ones of the pattern traces lean against each other and, in some cases, become broken or separated. The occurrence of such a pattern collapse makes it impossible to obtain a desired product and thus leads to a deterioration in the manufacturing yield and reliability of the product.

It has been shown that the pattern collapse occurs, during a cleaning process after the formation of the pattern, due to a surface tension of a cleaning liquid caused by drying of the cleaning liquid. More specifically, a stress is exerted between the pattern traces due to the surface tension of the cleaning liquid when the cleaning liquid is removed during the drying step, whereby the pattern collapse occurs under the action of such a stress.

Patent Document 1 discloses a technique of, for the purpose of preventing a pattern collapse in an inorganic pattern or resin pattern on a substrate, performing surface treatment on the workpiece (i.e. the pattern on the substrate) with the use of a surface treatment agent including a silylation reagent and a silicon-free nitrogen-containing heterocyclic compound and thereby imparting water repellency to the workpiece.

PRIOR ART DOCUMENTS

Patent Documents

Patent Document 1: Japanese Laid-Open Patent Publication No. 2017-063179

SUMMARY OF THE INVENTION

Problems to be Solved by the Invention

The present inventors have however found that the surface treatment agent including the silylation reagent and the silicon-free nitrogen-containing heterocyclic compound may have the following problems: it takes time to dissolve the raw material during preparation of the surface treatment agent; and the surface treatment agent does not exert a sufficient water repellency imparting effect. It is accordingly an object of the present disclosure to provide a novel surface treatment agent capable of solving these problems.

Means for Solving the Problems

One aspect of the present disclosure is directed to a surface treatment agent for surface treatment of a workpiece, comprising the following components:

(I) at least one kind selected from the group consisting of silicon compounds represented by the following general formulas [1], [2] and [3];

(II) at least one kind selected from the group consisting of a nitrogen-containing heterocyclic compound represented by the following general formula [4], a nitrogen-containing heterocyclic compound represented by the following general formula [5], and imidazole; and (III) an organic solvent.

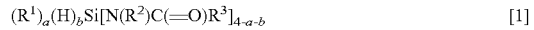
$(R^1)_a(H)_b Si[N(R^2)C(=O)R^3]_{4-a-b}$ [1]

In the general formula [1], $R^1$ is each independently a monovalent hydrocarbon group of 1 to 18 carbon atoms in which a part or all of hydrogen atoms may be substituted with a fluorine atom; $R^2$ is each independently a group selected from the group consisting of an alkyl group of 1 to 6 carbon atoms in which a part or all of hydrogen atoms may be substituted with a fluorine atom, and a hydrogen atom; $R^3$ is each independently an alkyl group of 1 to 6 carbon atoms in which a part or all of hydrogen atoms may be substituted with a fluorine atom; a is an integer of 1 to 3; b is an integer of 0 to 2; and the sum of a and b is 1 to 3.

$(R^4)_c(H)_d Si[OC(=O)R^5]_{4-c-d}$ [2]

In the general formula [2], $R^4$ is each independently a monovalent hydrocarbon group of 1 to 18 carbon atoms in which a part or all of hydrogen atoms may be substituted with a fluorine atom; $R^5$ is each independently an alkyl group of 1 to 6 carbon atoms in which a part or all of hydrogen atoms may be substituted with a fluorine atom; c is an integer of 1 to 3; d is an integer of 0 to 2; and the sum of c and d is 1 to 3.

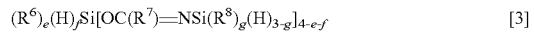
$(R^6)_e(H)_f Si[OC(R^7)=NSi(R^8)_g(H)_{3-g}]_{4-e-f}$ [3]

In the general formula [3], $R^6$ and $R^8$ are each independently a monovalent hydrocarbon group of 1 to 18 carbon atoms in which a part or all of hydrogen atoms may be substituted with a fluorine atom; $R^7$ is each independently a group selected from the group consisting of an alkyl group of 1 to 6 carbon atoms in which a part or all of hydrogen atoms may be substituted with a fluorine atom, and a hydrogen atom; e is an integer of 1 to 3; f is an integer of 0 to 2; g is an integer of 1 to 3; and the sum of e and f is 1 to 3.

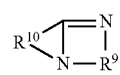

[4]

In the general formula [4], $R^9$ and $R^{10}$ are each independently a divalent organic group consisting of carbon and/or nitrogen and hydrogen; the total number of carbon and nitrogen atoms in the divalent organic group is 1 to 9; and, when the total number of carbon and nitrogen atoms in the divalent organic group is 2 or more, there may be present any carbon atom without constituting a cyclic structure.

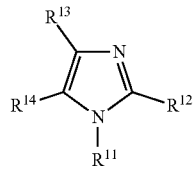

[5]

In the general formula [5], $R^{11}$ is an alkyl group of 1 to 6 carbon atoms in which a part or all of hydrogen atoms may be substituted with a fluorine atom, a trialkylsilyl group having an alkyl group of 1 to 8 carbon atoms in which a part or all of hydrogen atoms may be substituted with a fluorine atom, an alkenyl group of 2 to 6 carbon atoms in which a part or all of hydrogen atoms may be substituted with a fluorine atom, an alkoxy group of 1 to 6 carbon atoms in which a part or all of hydrogen atoms may be substituted with a fluorine atom, an amino group, an alkylamino group having an alkyl group of 1 to 6 carbon atoms in which a part or all of hydrogen atoms may be substituted with a fluorine atom, a dialkylamino group having an alkyl group of 1 to 6 carbon atoms in which a part or all of hydrogen atoms may be substituted with a fluorine atom, an aminoalkyl group of 1 to 6 carbon atoms in which a part or all of hydrogen atoms may be substituted with a fluorine atom, a nitro group, a cyano group, a phenyl group, a benzyl group, or a halogen atom; $R^{12}$, $R^{13}$ and $R^{14}$ are each independently an alkyl group of 1 to 6 carbon atoms in which a part or all of hydrogen atoms may be substituted with a fluorine atom, or a hydrogen atom.

The concentration of the component (II) is preferably 0.05 to 10 mass % based on the total amount of the components (I) to (III).

Preferably, the component (II) is liquid at 25° C. and 1 atmospheric pressure in terms of the solubility.

In terms of the solubility, the component (II) is preferably at least one selected from the group consisting of 1,5-diazabicyclo[4.3.0]-5-nonene, 1,8-diazabicyclo[5.4.0]-7-undecene, 7-methyl-1,5,7-triazabicyclo[4.4.0]dec-5-ene, N-methylimidazole, N-ethylimidazole, N-propylimidazole, N-butylimidazole and trimethylsilylimidazole. Among others, the component (II) is more preferably at least one selected from the group consisting of 1,5-diazabicyclo[4.3.0]-5-nonene, 1,8-diazabicyclo[5.4.0]-7-undecene, 7-methyl-1,5,7-triazabicyclo[4.4.0]dec-5-ene, N-methylimidazole, N-ethylimidazole, N-propylimidazole and N-butylimidazole for good water repellency imparting effect. The component (II) is particularly preferably at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene for better water repellency imparting effect.

The concentration of the component (I) is preferably 0.1 to 35 mass % based on the total amount of the components (I) to (III) so as to facilitate uniform formation of a protective film on a surface of the workpiece. When the concentration of the component (I) is lower than 0.1 mass %, the water repellency imparting effect tends to become insufficient. When the concentration of the component (I) is higher than 35 mass %, the surface treatment agent may cause surface erosion of the workpiece or may remain as an impurity on the surface of the workpiece. Further, it is not favorable to use the component (I) at such a high concentration from the viewpoint of cost. The concentration of the component (I) is more preferably 0.5 to 30 mass %, still more preferably 1 to 20 mass %, yet more preferably 1 to 9 mass %.

For good water repellency imparting effect, it is preferable that the surface treatment agent contains at least one kind of silicon compound represented by the general formula [1] where a is 3; $R^2$ is a methyl group; and $R^3$ is a fluorine-containing alkyl group of 1 to 6 carbon atoms as the component (I). Among others, $(CH_3)_3SiN(CH_3)C(=O)CF_3$ is particularly preferred as the component (I).

In the case where the silicon compound represented by the general formula (2) is contained as the component (I), it is preferable to use at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene as the component (II) for good water repellency imparting effect.

Further, it is preferable that the surface treatment agent contains at least one kind of silicon compound represented by the general formula [2] where c is 3; and $R^5$ is a fluorine-containing alkyl group of 1 to 6 carbon atoms as the component (I) for good water repellency imparting effect. Among others, $(CH_3)_3SiOC(=O)CF_3$ is particularly preferred as the component (I) in terms of the water repellency imparting effect.

It is preferable that the surface treatment agent contains, as the component (I), at least one kind of silicon compound (I-1) represented by the general formula [1] where a is 3; $R^2$ is a hydrogen atom; and $R^3$ is a fluorine-containing alkyl group of 1 to 6 carbon atoms, and at least one kind of silicon compound (I-2) represented by the general formula [2] where c is 3; and $R^5$ is a fluorine-containing alkyl group of 1 to 6 carbon atoms so that, even when water is mixed into the surface treatment agent, the water repellency imparting effect on the surface of the workpiece is easily and stably maintained. In particular, $(CH_3)_3SiN(H)C(=O)CF_3$ is preferred as the silicon compound (I-1); and $(CH_3)_3SiOC(=O)CF_3$ is preferred as the silicon compound (I-2).

It is more preferable that the component (II) is at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene for particularly good water repellency imparting effect.

Furthermore, it is preferable that the surface treatment agent contains at least one kind of silicon compound represented by the general formula [3] where each of e and g is 3; and $R^7$ is a methyl group or a trifluoromethyl group as the component (I) for good water repellency imparting effect. Among others, $(CH_3)_3SiOC(CF_3)=NSi(CH_3)_3$ is particularly preferred as the component (I).

In the case where the silicon compound represented by the general formula [3] is contained as the component (I), it is preferable to use at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene as the component (II) for good water repellency imparting effect. Among others, it is more preferable to use at least one selected from the group consisting of 1,5-diazabicyclo[4.3.0]-5-nonene and 1,8-diazabicyclo[5.4.0]-7-undecene for particularly good water repellency imparting effect.

The organic solvent is preferably an aprotic solvent.

Another aspect of the present disclosure is directed to a method of manufacturing a surface-treated body, comprising: treating a surface of a workpiece by bringing the above-mentioned surface treatment agent into contact with the surface of the workpiece.

Effects of the Invention

According to the present disclosure, there is provided the surface treatment agent with no possibilities that: it takes time to dissolve the raw material during preparation of the surface treatment agent; and the water repellency imparting effect of the surface treatment agent becomes insufficient. There is also provided the method of manufacturing the surface-treated body by the use of the surface treatment agent.

DETAILED DESCRIPTION OF THE EMBODIMENTS

1. Surface Treatment Agent

Figure 1:
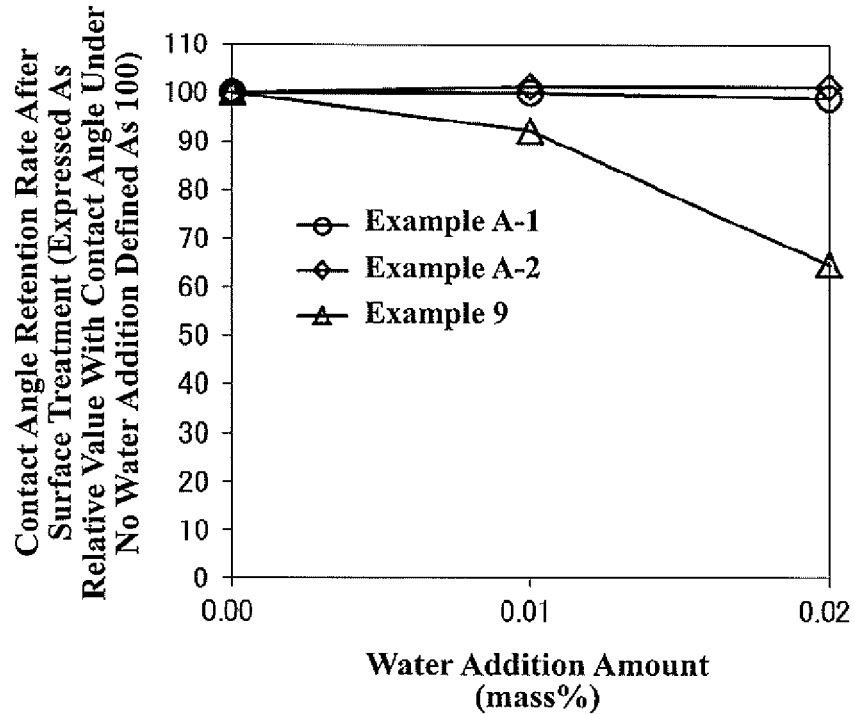
FIG. 1 is a plot of the contact angle retention rate after surface treatment (Examples A-1, A-2 and 9) relative to the water addition amount.

A surface treatment agent according to the present disclosure is used for silylation of a surface of a workpiece, and includes the following components:

(I) at least one kind selected from the group consisting of silicon compounds represented by the above-mentioned general formulas [1], [2] and [3];

(II) at least one kind selected from the group consisting of a nitrogen-containing heterocyclic compound represented by the above-mentioned general formula [4], a nitrogen-containing heterocyclic compound represented by the above-mentioned general formula [5], and imidazole; and (III) an organic solvent.

There is no particular limitation on the kind of the workpiece treated with the surface treatment agent according to the present disclosure. Preferably, the workpiece is a substrate. As the "substrate" to be subjected to sililation treatment, there can be exemplified a substrate for manufacturing of a semiconductor device. The "surface of the workpiece" refers to a surface of the substrate itself, a surface of an inorganic pattern or resin pattern formed on the substrate, or a surface of an unpatterned inorganic layer or organic layer formed on the substrate.

An example of the inorganic pattern formed on the substrate is a pattern formed by providing an etching mask by a photoresist technique on an inorganic layer present on the substrate and etching the inorganic layer through the etching mask. The inorganic layer can be the substrate itself, an oxide film of an element constituting the substrate, a film or layer of inorganic substance such as silicon nitride, titanium nitride or tungsten formed on the substrate etc. There is no particular limitation on such a film or layer. The film or layer may be any film or layer of inorganic substance formed during the manufacturing process of the semiconductor device.

An example of the resin pattern formed on the substrate is a resin pattern formed by a photoresist technique on the substrate. This resin pattern is obtained by providing an organic layer as a photoresist film on the substrate, exposing the organic layer to light through a photomask and developing the exposed organic layer. The organic layer can be the surface of the substrate itself, a surface of a laminated film provided on the surface of the substrate etc. There is no particular limitation on the organic layer. The organic layer may be a film of organic substance applied for formation of the etching mask during the manufacturing of the semiconductor device.

The surface treatment agent is of the solution type where the components (I) and (II) are dissolved in the organic solvent as the component (III). The surface treatment can be performed by applying the surface treatment agent to the surface of the workpiece such as substrate by a spin coating method, an immersion method or the like and thereby bringing the surface treatment agent into contact with the surface of the workpiece. Alternatively, the surface treatment can be performed by vaporizing the surface treatment agent, supplying the vapor of the surface treatment agent to the surface of the workpiece such as substrate and thereby bringing the surface treatment agent into contact with the surface of the workpiece.

Hereinafter, the respective components will be explained below.

Component (I): Silicon Compound

Each of $R^1$ in the general formula [1], $R^4$ in the general formula [2] and $R^6$ in the general formula [3] is a water-repellent functional group. A protective film having water repellency (hereinafter also referred to as "water-repellent protective film" or simply referred to as "protective film") is formed on the workpiece by reacting a $-N(R^2)C(=O)R^3$ group in the general formula [1], a $-OC(=O)R^5$ group in the general formula [2] or a $-OC(R^7)=NSi(R^8)_g(H)_{3-g}$ group in the general formula [3] with the surface of the workpiece and fixing the water-repellent functional group to the surface of the workpiece. It is preferable that the group of the silicon compound reacted with the surface of the workpiece has a structure capable of enhancing the water repellency of the protective film.

The combined use of such a silicon compound with the component (II) allows prompt reaction between the silicon compound and the surface of the workpiece so as to exhibit a water repellency imparting effect.

Specific examples of the silicon compound of the general formula [1] include: N-methyl-N-alkylsilyltrifluoroacetamides such as $CH_3Si[N(CH_3)C(=O)CF_3]_3$, $C_2H_5Si[N(CH_3)C(=O)CF_3]_3$, $C_3H_7Si[N(CH_3)C(=O)CF_3]_3$, $C_4H_9Si[N(CH_3)C(=O)CF_3]_3$, $C_5H_{11}Si[N(CH_3)C(=O)CF_3]_3$, $C_6H_{13}Si[N(CH_3)C(=O)CF_3]_3$, $C_7H_{15}Si[N(CH_3)C(=O)CF_3]_3$, $C_8H_{17}Si[N(CH_3)C(=O)CF_3]_3$, $C_9H_{19}Si[N(CH_3)C(=O)CF_3]_3$, $C_{10}H_{21}Si[N(CH_3)C(=O)CF_3]_3$, $C_{11}H_{23}Si[N(CH_3)C(=O)CF_3]_3$, $C_{12}H_{25}Si[N(CH_3)C(=O)CF_3]_3$, $C_{13}H_{27}Si[N(CH_3)C(=O)CF_3]_3$, $C_{14}H_{29}S[N(CH_3)C(=O)CF_3]_3$, $C_{11}H_{31}Si[N(CH_3)C(=O)CF_3]_3$, $C_{16}H_{33}Si[N(CH_3)C(=O)CF_3]_3$, $C_{17}H_{35}Si[N(CH_3)C(=O)CF_3]_3$, $C_{18}H_{37}Si[N(CH_3)C(=O)CF_3]_3$, $(CH_3)_2Si[N(CH_3)C(=O)CF_3]_2$, $C_2H_5Si(CH_3)[N(CH_3)C(=O)CF_3]_2$, $(C_2H_5)_2Si[N(CH_3)C(=O)CF_3]_2$, $C_3H_7Si(CH_3)[N(CH_3)C(=O)CF_3]_2$, $(C_3H_7)_2$ Si[N(CH$_3$)C(=O)CF$_3$]$_2$, C$_4$H$_9$Si(CH$_3$)[N(CH$_3$)C(=O)CF$_3$]$_2$, (C$_4$H$_9$)$_2$Si[N(CH$_3$)C(=O)CF$_3$]$_2$, C$_5$H$_{11}$Si(CH$_3$)[N(CH$_3$)C(=O)CF$_3$]$_2$, C$_6$H$_{13}$Si(CH$_3$)[N(CH$_3$)C(=O)CF$_3$]$_2$, C$_7$H$_{15}$Si(CH$_3$)[N(CH$_3$)C(=O)CF$_3$]$_2$, C$_8$H$_{17}$Si(CH$_3$)[N(CH$_3$)C(=O)CF$_3$]$_2$, C$_9$H$_{19}$Si(CH$_3$)[N(CH$_3$)C(=O)CF$_3$]$_2$, C$_{10}$H$_{21}$Si(CH$_3$)[N(CH$_3$)C(=O)CF$_3$]$_2$, C$_{11}$H$_{23}$Si(CH$_3$)[N(CH$_3$)C(=O)CF$_3$]$_2$, C$_{12}$H$_{25}$Si(CH$_3$)[N(CH$_3$)C(=O)CF$_3$]$_2$, C$_{13}$H$_{27}$Si(CH$_3$)[N(CH$_3$)C(=O)CF$_3$]$_2$, C$_{14}$H$_{29}$Si(CH$_3$)[N(CH$_3$)C(=O)CF$_3$]$_2$, C$_{15}$H$_{31}$Si(CH$_3$)[N(CH$_3$)C(=O)CF$_3$]$_2$, C$_{16}$H$_{33}$Si(CH$_3$)[N(CH$_3$)C(=O)CF$_3$]$_2$, C$_{17}$H$_{35}$S(CH$_3$)[N(CH$_3$)C(=O)CF$_3$]$_2$, C$_{15}$H$_{37}$Si(CH$_3$)[N(CH$_3$)C(=O)CF$_3$]$_2$, (CH$_3$)$_3$SiN(CH$_3$)C(=O)CF$_3$, C$_2$H$_5$Si(CH$_3$)$_2$N(CH$_3$)C(=O)CF$_3$, (C$_2$H$_5$)$_2$Si(CH$_3$)N(CH$_3$)C(=O)CF$_3$, (C$_2$H$_5$)$_3$SiN(CH$_3$)C(=O)CF$_3$, C$_3$H$_7$Si(CH$_3$)$_2$N(CH$_3$)C(=O)CF$_3$, (C$_3$H$_7$)$_2$Si(CH$_3$)N(CH$_3$)C(=O)CF$_3$, (C$_3$H$_7$)$_3$SiN(CH$_3$)C(=O)CF$_3$, C$_4$H$_9$Si(CH$_3$)$_2$N(CH$_3$)C(=O)CF$_3$, (C$_4$H$_9$)$_3$SiN(CH$_3$)C(=O)CF$_3$, C$_5$H$_{11}$Si(CH$_3$)$_2$N(CH$_3$)C(=O)CF$_3$, C$_6$H$_{13}$Si(CH$_3$)$_2$N(CH$_3$)C(=O)CF$_3$, C$_7$H$_{15}$Si(CH$_3$)$_2$N(CH$_3$)C(=O)CF$_3$, C$_8$H$_{17}$Si(CH$_3$)$_2$N(CH$_3$)C(=O)CF$_3$, C$_9$H$_{19}$Si(CH$_3$)$_2$N(CH$_3$)C(=O)CF$_3$, C$_{10}$H$_{21}$Si(CH$_3$)$_2$N(CH$_3$)C(=O)CF$_3$, C$_{11}$H$_{23}$Si(CH$_3$)$_2$N(CH$_3$)C(=O)CF$_3$, C$_{12}$H$_{25}$Si(CH$_3$)$_2$N(CH$_3$)C(=O)CF$_3$, C$_{13}$H$_{27}$Si(CH$_3$)$_2$N(CH$_3$)C(=O)CF$_3$, C$_{14}$H$_{29}$Si(CH$_3$)$_2$N(CH$_3$)C(=O)CF$_3$, C$_{15}$H$_{31}$Si(CH$_3$)$_2$N(CH$_3$)C(=O)CF$_3$, C$_{16}$H$_{33}$Si(CH$_3$)$_2$N(CH$_3$)C(=O)CF$_3$, C$_{17}$H$_{35}$Si(CH$_3$)$_2$N(CH$_3$)C(=O)CF$_3$, C$_{18}$H$_{37}$Si(CH$_3$)$_2$N(CH$_3$)C(=O)CF$_3$, (CH$_3$)$_2$Si(H)N(CH$_3$)C(=O)CF$_3$, CH$_3$Si(H)$_2$N(CH$_3$)C(=O)CF$_3$, (C$_2$H$_5$)$_2$Si(H)N(CH$_3$)C(=O)CF$_3$, C$_2$H$_5$Si(H)$_2$N(CH$_3$)C(=O)CF$_3$, C$_2$H$_5$Si(CH$_3$)(H)N(CH$_3$)C(=O)CF$_3$, (C$_3$H$_7$)$_2$Si(H)N(CH$_3$)C(=O)CF$_3$, C$_3$H$_7$Si(H)$_2$N(CH$_3$)C(=O)CF$_3$, CF$_3$CH$_2$CH$_2$Si[N(CH$_3$)C(=O)CF$_3$]$_3$, C$_2$F$_5$CH$_2$CH$_2$Si[N(CH$_3$)C(=O)CF$_3$]$_3$, C$_3$F$_7$CH$_2$CH$_2$Si[N(CH$_3$)C(=O)CF$_3$]$_3$, C$_4$F$_9$CH$_2$CH$_2$Si[N(CH$_3$)C(=O)CF$_3$]$_3$, C$_5$F$_{11}$CH$_2$CH$_2$Si[N(CH$_3$)C(=O)CF$_3$]$_3$, C$_6$F$_{13}$CH$_2$CH$_2$Si[N(CH$_3$)C(=O)CF$_3$]$_3$, C$_7$F$_{15}$CH$_2$CH$_2$Si[N(CH$_3$)C(=O)CF$_3$]$_3$, C$_8$F$_{17}$CH$_2$CH$_2$Si[N(CH$_3$)C(=O)CF$_3$]$_3$, CF$_3$CH$_2$CH$_2$Si(CH$_3$)[N(CH$_3$)C(=O)CF$_3$]$_2$, C$_2$F$_5$CH$_2$CH$_2$Si(CH$_3$)[N(CH$_3$)C(=O)CF$_3$]$_2$, C$_3$F$_7$CH$_2$CH$_2$Si(CH$_3$)[N(CH$_3$)C(=O)CF$_3$]$_2$, C$_4$F$_9$CH$_2$CH$_2$Si(CH$_3$)[N(CH$_3$)C(=O)CF$_3$]$_2$, C$_5$F$_{11}$CH$_2$CH$_2$Si(CH$_3$)[N(CH$_3$)C(=O)CF$_3$]$_2$, C$_6$F$_{13}$CH$_2$CH$_2$Si(CH$_3$)[N(CH$_3$)C(=O)CF$_3$]$_2$, C$_7$F$_{15}$CH$_2$CH$_2$Si(CH$_3$)[N(CH$_3$)C(=O)CF$_3$]$_2$, C$_8$F$_{17}$CH$_2$CH$_2$Si(CH$_3$)[N(CH$_3$)C(=O)CF$_3$]$_2$, CF$_3$CH$_2$CH$_2$Si(CH$_3$)$_2$N(CH$_3$)C(=O)CF$_3$, C$_2$F$_5$CH$_2$CH$_2$Si(CH$_3$)$_2$N(CH$_3$)C(=O)CF$_3$, C$_3$F$_7$CH$_2$CH$_2$Si(CH$_3$)$_2$N(CH$_3$)C(=O)CF$_3$, C$_4$F$_9$CH$_2$CH$_2$Si(CH$_3$)$_2$N(CH$_3$)C(=O)CF$_3$, C$_5$F$_{11}$CH$_2$CH$_2$Si(CH$_3$)$_2$N(CH$_3$)C(=O)CF$_3$, C$_6$F$_{13}$CH$_2$CH$_2$Si(CH$_3$)$_2$N(CH$_3$)C(=O)CF$_3$, C$_7$F$_{15}$CH$_2$CH$_2$Si(CH$_3$)$_2$N(CH$_3$)C(=O)CF$_3$, C$_8$F$_{17}$CH$_2$CH$_2$Si(CH$_3$)$_2$N(CH$_3$)C(=O)CF$_3$ and CF$_3$CH$_2$CH$_2$Si(CH$_3$)(H)N(CH$_3$)C(=O)CF$_3$; and those obtained by replacing —N(CH$_3$)C(=O)CF$_3$ groups of the aforementioned N-methyl-N-alkylsilyltrifluoroacetamides with a —N(CH$_3$)C(=O)R$^3$ group other than —N(CH$_3$)C(=O)CF$_3$ (where R$^3$ is an alkyl group of 1 to 6 carbon atoms in which a part or all of hydrogen atoms may be substituted with a fluorine atom). There can also be used those obtained by substituting methyl of —N(CH$_3$)C(=O)R$^3$ group of the above-exemplified compound with hydrogen, ethyl, propyl, butyl, trifluoromethyl, pentafluoroethyl, heptafluoropropyl, nonafluorobutyl etc. The silicon compound of the general formula [1] can be commercially available. For instance, N-methyl-N-trimethylsilyltrifluoroacetamide ((CH$_3$)$_3$SiN(CH$_3$)C(=O)CF$_3$) available from Tokyo Chemical Industry Co., Ltd. is usable.

In terms of the water repellency imparting effect, R$^2$ in the general formula [1] is preferably an alkyl group of 1 to 4 carbon atoms in which a part or all of hydrogen atoms may be substituted with a fluorine atom, or a hydrogen atom. More preferably, R$^2$ is an alkyl group of 1 to 4 carbon atoms, or a hydrogen atom. Among others, methyl is particularly preferable as R$^2$.

Further, R$^3$ in the general formula [1] is preferably an alkyl group in which all of hydrogen atoms are substituted with a fluorine atom in terms of the water repellency imparting effect. The alkyl group is more preferably of 1 to 4 carbon atoms, still more preferably 1 carbon atom.

The number of —N(R$^2$)C(=O)R$^3$ groups as represented by 4-a-b in the general formula [1] is preferably 1 to facilitate uniform formation of the protective film.

To readily maintain the water repellency during the after-mentioned cleaning step after the formation of the protective film, b in the general formula [1] is preferably 0.

The combination of two methyl groups and one linear alkyl group is preferable as R$^1$ in the general formula [1] to facilitate uniform formation of the protective film.

More preferably, R$^1$ are three methyl groups.

Specific examples of the silicon compound of the general formula [2] include: trifluoroacetoxysilanes such as CH$_3$Si(OC(=O)CF$_3$)$_3$, C$_2$H$_5$Si(OC(=O)CF$_3$)$_3$, C$_3$H$_7$Si(OC(=O)CF$_3$)$_3$, C$_4$H$_9$Si(OC(=O)CF$_3$)$_3$, C$_5$H$_{11}$Si(OC(=O)CF$_3$)$_3$, C$_6$H$_{13}$Si(OC(=O)CF$_3$)$_3$, C$_7$H$_{15}$Si(OC(=O)CF$_3$)$_3$, C$_8$H$_{17}$Si(OC(=O)CF$_3$)$_3$, C$_9$H$_{19}$S(OC(=O)CF$_3$)$_3$, C$_{10}$H$_{21}$Si(OC(=O)CF$_3$)$_3$, C$_{11}$H$_{23}$Si(OC(=O)CF$_3$)$_3$, C$_{12}$H$_{25}$Si(OC(=O)CF$_3$)$_3$, C$_{13}$H$_{27}$S(OC(=O)CF$_3$)$_3$, C$_{14}$H$_{29}$S(OC(=O)CF$_3$)$_3$, C$_{15}$H$_{31}$S(OC(=O)CF$_3$)$_3$, C$_{16}$H$_{33}$S(OC(=O)CF$_3$)$_3$, C$_{17}$H$_{35}$Si(OC(=O)CF$_3$)$_3$, C$_{18}$H$_{37}$S(OC(=O)CF$_3$)$_3$, (CH$_3$)$_2$Si(OC(=O)CF$_3$)$_2$, C$_2$H$_5$Si(CH$_3$)(OC(=O)CF$_3$)$_2$, (C$_2$H$_5$)$_2$Si(OC(=O)CF$_3$)$_2$, C$_3$H$_7$Si(CH$_3$)(OC(=O)CF$_3$)$_2$, (C$_3$H$_7$)$_2$Si(OC(=O)CF$_3$)$_2$, C$_4$H$_9$Si(CH$_3$)(OC(=O)CF$_3$)$_2$, (C$_4$H$_9$)$_2$Si(OC(=O)CF$_3$)$_2$, C$_5$H$_{11}$Si(CH$_3$)(OC(=O)CF$_3$)$_2$, C$_6$H$_{13}$Si(CH$_3$)(OC(=O)CF$_3$)$_2$, C$_7$H$_{15}$Si(CH$_3$)(OC(=O)CF$_3$)$_2$, C$_8$H$_{17}$Si(CH$_3$)(OC(=O)CF$_3$)$_2$, C$_9$H$_{19}$Si(CH$_3$)(OC(=O)CF$_3$)$_2$, C$_{10}$H$_{21}$Si(CH$_3$)(OC(=O)CF$_3$)$_2$, C$_{11}$H$_{23}$Si(CH$_3$)(OC(=O)CF$_3$)$_2$, C$_{12}$H$_{25}$S(CH$_3$)(OC(=O)CF$_3$)$_2$, C$_{13}$H$_{27}$S(CH$_3$)(OC(=O)CF$_3$)$_2$, C$_{14}$H$_{29}$Si(CH$_3$)(OC(=O)CF$_3$)$_2$, C$_{15}$H$_{31}$Si(CH$_3$)(OC(=O)CF$_3$)$_2$, C$_{16}$H$_{33}$Si(CH$_3$)(OC(=O)CF$_3$)$_2$, C$_{17}$H$_{35}$Si(CH$_3$)(OC(=O)CF$_3$)$_2$, C$_{18}$H$_{37}$S(CH$_3$)(OC(=O)CF$_3$)$_2$, (CH$_3$)$_3$SiOC(=O)CF$_3$, C$_2$H$_5$Si(CH$_3$)$_2$OC(=O)CF$_3$, (C$_2$H$_5$)$_2$Si(CH$_3$)OC(=O)CF$_3$, (C$_2$H$_5$)$_3$SiOC(=O)CF$_3$, C$_3$H$_7$Si(CH$_3$)$_2$OC(=O)CF$_3$, (C$_3$H$_7$)$_2$Si(CH$_3$)OC(=O)CF$_3$, (C$_3$H$_7$)$_3$SiOC(=O)CF$_3$, C$_4$H$_9$Si(CH$_3$)$_2$OC(=O)CF$_3$, (C$_4$H$_9$)$_3$SiOC(=O)CF$_3$, C$_5$H$_{11}$Si(CH$_3$)$_2$OC(=O)CF$_3$, C$_6$H$_{13}$Si(CH$_3$)$_2$OC(=O)CF$_3$, C$_7$H$_{15}$Si(CH$_3$)$_2$OC(=O)CF$_3$, C$_8$H$_{17}$Si(CH$_3$)$_2$OC(=O)CF$_3$, C$_9$H$_{19}$Si(CH$_3$)$_2$OC(=O)CF$_3$, C$_{10}$H$_{21}$Si(CH$_3$)$_2$OC(=O)CF$_3$, C$_{11}$H$_{23}$Si(CH$_3$)$_2$OC(=O)CF$_3$, C$_{12}$H$_{25}$Si(CH$_3$)$_2$OC(=O)CF$_3$, C$_{13}$H$_{27}$S(CH$_3$)$_2$OC(=O)CF$_3$, C$_{14}$H$_{29}$Si(CH$_3$)$_2$OC(=O)CF$_3$, C$_{15}$H$_{31}$Si(CH$_3$)$_2$OC(=O)CF$_3$, C$_{16}$H$_{33}$Si(CH$_3$)$_2$OC(=O)CF$_3$, C$_{17}$H$_{35}$Si(CH$_3$)$_2$OC(=O)CF$_3$, C$_{15}$H$_{37}$Si(CH$_3$)$_2$OC(=O)CF$_3$, (CH$_3$)$_2$Si(H)OC(=O)CF$_3$, CH$_3$Si(H)$_2$OC(=O)CF$_3$, (C$_2$H$_5$)$_2$Si(H)OC(=O)CF$_3$, C$_2$H$_5$Si(H)$_2$OC(=O)CF$_3$, C$_2$H$_5$Si(CH$_3$)(H)OC(=O)CF$_3$, (C$_3$H$_7$)$_2$Si(H)OC(=O)CF$_3$, C$_3$H$_7$Si(H)$_2$OC(=O)CF$_3$, CF$_3$CH$_2$CH$_2$Si(OC(=O)CF$_3$)$_3$, C$_2$F$_5$CH$_2$CH$_2$Si(OC(=O)CF$_3$)$_3$, C$_3$F$_7$CH$_2$CH$_2$Si(OC(=O)CF$_3$)$_3$, C$_4$F$_9$CH$_2$CH$_2$Si(OC(=O)CF$_3$)$_3$, C$_5$F$_{11}$CH$_2$CH$_2$Si(OC(=O)CF$_3$)$_3$, C$_6$F$_{13}$CH$_2$CH$_2$Si(OC(=O)CF$_3$)$_3$, C$_7$F$_{15}$CH$_2$CH$_2$Si(OC(=O)CF$_3$)$_3$, C$_8$F$_{17}$CH$_2$CH$_2$Si(OC(=O)CF$_3$)$_3$, CF$_3$CH$_2$CH$_2$Si(CH$_3$)(OC(=O)CF$_3$)$_2$, C$_2$F$_5$CH$_2$CH$_2$Si(CH$_3$)(OC(=O)CF$_3$)$_2$, C$_3$F$_7$CH$_2$CH$_2$Si(CH$_3$)(OC(=O)CF$_3$)$_2$, C$_4$F$_9$CH$_2$CH$_2$Si(CH$_3$)(OC(=O)CF$_3$)$_2$, C$_5$F$_{11}$CH$_2$CH$_2$Si(CH$_3$)(OC(=O)CF$_3$)$_2$, C$_6$F$_{13}$CH$_2$CH$_2$Si(CH$_3$)(OC(=O)CF$_3$)$_2$, C$_7$F$_{15}$CH$_2$CH$_2$Si(CH$_3$)(OC(=O)CF$_3$)$_2$, C$_8$F$_{17}$CH$_2$CH$_2$Si(CH$_3$)(OC(=O)

$CF_3)_2$, $CF_3CH_2CH_2Si(CH_3)_2OC(=O)CF_3$, $C_2F_5CH_2CH_2Si(CH_3)_2OC(=O)CF_3$, $C_3F_7CH_2CH_2Si(CH_3)_2OC(=O)CF_3$, $C_4F_9CH_2CH_2Si(CH_3)_2OC(=O)CF_3$, $C_5F_{11}CH_2CH_2Si(CH_3)_2OC(=O)CF_3$, $C_6F_{13}CH_2CH_2Si(CH_3)_2OC(=O)CF_3$, $C_7F_{15}CH_2CH_2Si(CH_3)_2OC(=O)CF_3$, $C_8F_{17}CH_2CH_2Si(CH_3)_2OC(=O)CF_3$ and $CF_3CH_2CH_2Si(CH_3)_2(H)OC(=O)CF_3$; and those obtained by replacing —OC(=O)CF$_3$ groups of the aforementioned trifluoroacetoxysilanes with a —OC(=O)R$^5$ group other than —OC(=O)CF$_3$ (R$^5$ is an alkyl group of 1 to 6 carbon atoms in which a part or all of hydrogen atoms may be substituted with fluorine). The silicon compound of the general formula [2] can be commercially available. For instance, trimethylsilyltrifluoroacetate (($CH_3)_3Si$—OC(=O)CF$_3$) available from Tokyo Chemical Industry Co., Ltd. is usable.

In terms of the water repellency imparting effect, R$^5$ of the —OC(=O)R$^5$ group is preferably an alkyl group in which all of hydrogen atoms are substituted with a fluorine atom. The alkyl group is more preferably of 1 to 4 carbon atoms, still more preferably 1 carbon atom.

The number of —OC(=O)R$^5$ groups as represented by 4-c-d in the general formula [2] is preferably 1 to facilitate uniform formation of the protective film.

To readily maintain the water repellency during the aftermentioned cleaning step after the formation of the protective film, d in the general formula [2] is preferably 0.

The combination of two methyl groups and one linear alkyl group is preferable as R$^4$ in the general formula [2] to facilitate uniform formation of the protective film.

More preferably, R$^4$ are three methyl groups.

Specific examples of the silicon compound of the general formula [3] include: $CH_3Si[OC(CH_3)=NSi(CH_3)_3]_3$, $C_2H_5Si[OC(CH_3)=NS(CH_3)_3]_3$, $C_3H_7Si[OC(CH_3)=NSi(CH_3)_3]_3$, $C_4H_9Si[OC(CH_3)=NS(CH_3)_3]_3$, $C_5H_{11}Si[OC(CH_3)=NSi(CH_3)_3]_3$, $C_6H_{13}Si[OC(CH_3)=NS(CH_3)_3]_3$, $C_7H_{15}Si[OC(CH_3)=NSi(CH_3)_3]_3$, $C_8H_{17}Si[OC(CH_3)=NS(CH_3)_3]_3$, $C_9H_{19}Si[OC(CH_3)=NSi(CH_3)_3]_3$, $C_{10}H_{21}Si[OC(CH_3)=NSi(CH_3)_3]_3$, $C_{11}H_{23}Si[OC(CH_3)=NS(CH_3)_3]_3$, $C_{12}H_{25}Si[OC(CH_3)=NS(CH_3)_3]_3$, $C_{13}H_{27}Si[OC(CH_3)=NSi(CH_3)_3]_3$, $C_{14}H_{29}Si[OC(CH_3)=NSi(CH_3)_3]_3$, $C_{15}H_{31}Si[OC(CH_3)=NSi(CH_3)_3]_3$, $C_{16}H_{33}Si[OC(CH_3)=NS(CH_3)_3]_3$, $C_{17}H_{35}Si[OC(CH_3)=NSi(CH_3)_3]_3$, $C_{15}H_{37}Si[OC(CH_3)=NSi(CH_3)_3]_3$, $(CH_3)_2Si[OC(CH_3)=NSi(CH_3)_3]_2$, $C_2H_5Si(CH_3)[OC(CH_3)=NSi(CH_3)_3]_2$, $(C_2H_5)_2Si[OC(CH_3)=NSi(CH_3)_3]_2$, $C_3H_7Si(CH_3)[OC(CH_3)=NS(CH_3)_3]_2$, $(C_3H_7)_2Si[OC(CH_3)=NSi(CH_3)_3]_2$, $C_4H_9Si(CH_3)[OC(CH_3)=NSi(CH_3)_3]_2$, $(C_4H_9)_2Si[OC(CH_3)=NSi(CH_3)_3]_2$, $C_5H_{11}Si(CH_3)[OC(CH_3)=NSi(CH_3)_3]_2$, $C_6H_{13}Si(CH_3)[OC(CH_3)=NSi(CH_3)_3]_2$, $C_7H_{15}Si(CH_3)[OC(CH_3)=NSi(CH_3)_3]_2$, $C_8H_{17}Si(CH_3)[OC(CH_3)=NSi(CH_3)_3]_2$, $C_9H_{19}Si(CH_3)[OC(CH_3)=NSi(CH_3)_3]_2$, $C_{10}H_{21}Si(CH_3)[OC(CH_3)=NSi(CH_3)_3]_2$, $C_{11}H_{23}Si(CH_3)[OC(CH_3)=NSi(CH_3)_3]_2$, $C_{12}H_{25}Si(CH_3)[OC(CH_3)=NSi(CH_3)_3]_2$, $C_{13}H_{27}Si(CH_3)[OC(CH_3)=NS(CH_3)_3]_2$, $C_{14}H_{29}S(CH_3)[OC(CH_3)=NS(CH_3)_3]_2$, $C_{11}H_{31}Si(CH_3)[OC(CH_3)=NS(CH_3)_3]_2$, $C_{16}H_{33}Si(CH_3)[OC(CH_3)=NSi(CH_3)_3]_2$, $C_{17}H_{35}Si(CH_3)[OC(CH_3)=NSi(CH_3)_3]_2$, $C_{18}H_{37}Si(CH_3)[OC(CH_3)=NSi(CH_3)_3]_2$, $(CH_3)_3SiOC(CH_3)=NSi(CH_3)_3$, $C_2H_5Si(CH_3)_2OC(CH_3)=NSi(CH_3)_3$, $(C_2H_5)_2Si(CH_3)OC(CH_3)=NSi(CH_3)_3$, $(C_2H_5)_2SiOC(CH_3)=NSi(CH_3)_3$, $C_3H_7Si(CH_3)_2OC(CH_3)=NS(CH_3)_3$, $(C_3H_7)_2Si(CH_3)OC(CH_3)=NSi(CH_3)_3$, $(C_3H_7)_2SiOC(CH_3)=NSi(CH_3)_3$, $C_4H_9Si(CH_3)_2OC(CH_3)=NSi(CH_3)_3$, $(C_4H_9)_2SiOC(CH_3)=NS(CH_3)_3$, $C_5H_{11}Si(CH_3)_2OC(CH_3)=NSi(CH_3)_3$, $C_6H_{13}Si(CH_3)_2OC(CH_3)=NSi(CH_3)_3$, $C_7H_{15}Si(CH_3)_2OC(CH_3)=NSi(CH_3)_3$, $C_8H_{17}Si(CH_3)_2OC(CH_3)=NSi(CH_3)_3$, $C_9H_{19}Si(CH_3)_2OC(CH_3)=NSi(CH_3)_3$, $C_{10}H_{21}Si(CH_3)_2OC(CH_3)=NSi(CH_3)_3$, $C_{11}H_{23}Si(CH_3)_2OC(CH_3)=NSi(CH_3)_3$, $C_{12}H_{25}Si(CH_3)_2OC(CH_3)=NSi(CH_3)_3$, $C_{13}H_{27}Si(CH_3)_2OC(CH_3)=NSi(CH_3)_3$, $C_{14}H_{29}Si(CH_3)_2OC(CH_3)=NSi(CH_3)_3$, $C_{15}H_{31}Si(CH_3)_2OC(CH_3)=NSi(CH_3)_3$, $C_{16}H_{33}Si(CH_3)_2OC(CH_3)=NSi(CH_3)_3$, $C_{17}H_{35}Si(CH_3)_2OC(CH_3)=NSi(CH_3)_3$, $C_{18}H_{37}Si(CH_3)_2OC(CH_3)=NSi(CH_3)_3$, $(CH_3)_2Si(H)OC(CH_3)=NSi(CH_3)_3$, $CH_3Si(H)_2OC(CH_3)=NSi(CH_3)_3$, $(C_2H_5)_2Si(H)OC(CH_3)=NSi(CH_3)_3$, $C_2H_5Si(H)_2OC(CH_3)=NSi(CH_3)_3$, $C_2H_5Si(CH_3)(H)OC(CH_3)=NSi(CH_3)_3$, $(C_3H_7)_2Si(H)OC(CH_3)=NSi(CH_3)_3$, $C_3H_7Si(H)_2OC(CH_3)=NSi(CH_3)_3$, $CF_3CH_2CH_2Si[OC(CH_3)=NSi(CH_3)_3]_3$, $C_2F_5CH_2CH_2Si[OC(CH_3)=NSi(CH_3)_3]_3$, $C_3F_7CH_2CH_2Si[OC(CH_3)=NSi(CH_3)_3]_3$, $C_4F_9CH_2CH_2Si[OC(CH_3)=NSi(CH_3)_3]_3$, $C_5F_{11}CH_2CH_2Si[OC(CH_3)=NSi(CH_3)_3]_3$, $C_6F_{13}CH_2CH_2Si[OC(CH_3)=NSi(CH_3)_3]_3$, $C_7F_{15}CH_2CH_2Si[OC(CH_3)=NSi(CH_3)_3]_3$, $C_8F_{17}CH_2CH_2Si[OC(CH_3)=NSi(CH_3)_3]_3$, $CF_3CH_2CH_2Si(CH_3)[OC(CH_3)=NSi(CH_3)_3]_2$, $C_2F_5CH_2CH_2Si(CH_3)[OC(CH_3)=NSi(CH_3)_3]_2$, $C_3F_7CH_2CH_2Si(CH_3)[OC(CH_3)=NSi(CH_3)_3]_2$, $C_4F_9CH_2CH_2Si(CH_3)[OC(CH_3)=NSi(CH_3)_3]_2$, $C_5F_{11}CH_2CH_2Si(CH_3)[OC(CH_3)=NSi(CH_3)_3]_2$, $C_6F_{13}CH_2CH_2Si(CH_3)[OC(CH_3)=NSi(CH_3)_3]_2$, $C_7F_{15}CH_2CH_2Si(CH_3)[OC(CH_3)=NSi(CH_3)_3]_2$, $C_8F_{17}CH_2CH_2Si(CH_3)[OC(CH_3)=NSi(CH_3)_3]_2$, $CF_3CH_2CH_2Si(CH_3)_2OC(CH_3)=NSi(CH_3)_3$, $C_2F_5CH_2CH_2Si(CH_3)_2OC(CH_3)=NSi(CH_3)_3$, $C_3F_7CH_2CH_2Si(CH_3)_2OC(CH_3)=NSi(CH_3)_3$, $C_4F_9CH_2CH_2Si(CH_3)_2OC(CH_3)=NSi(CH_3)_3$, $C_5F_{11}CH_2CH_2Si(CH_3)_2OC(CH_3)=NSi(CH_3)_3$, $C_6F_{13}CH_2CH_2Si(CH_3)_2OC(CH_3)=NSi(CH_3)_3$, $C_7F_{15}CH_2CH_2Si(CH_3)_2OC(CH_3)=NSi(CH_3)_3$, $C_8F_{17}CH_2CH_2Si(CH_3)_2OC(CH_3)=NSi(CH_3)_3$, $CF_3CH_2CH_2Si(CH_3)(H)OC(CH_3)=NSi(CH_3)_3$ and the like; and those obtained by replacing —OC(CH$_3$)=NSi(CH$_3$)$_3$ groups of the aforementioned compounds with a —OC(CH$_3$)=NSi(R$^8$)$_g$(H)$_{3-g}$ group other than —OC(CH$_3$)=NSi(CH$_3$)$_3$ (where R is a monovalent hydrocarbon group of 1 to 18 carbon atoms in which a part or all of hydrogen atoms may be substituted with fluorine). There can also be used those obtained by substituting methyl of —OC(CH$_3$)=NSi(R$^8$)$_g$(H)$_{3-g}$ group of the above-exemplified compound with hydrogen, ethyl, propyl, butyl, trifluoromethyl, pentafluoroethyl, heptafluoropropyl, nonafluorobutyl etc. The silicon compound of the general formula [3] can be commercially available. For instance, N,O-bis(trimethylsilyl)trifluoroacetamide (($CH_3)_3SiOC(CF_3)=NSi(CH_3)_3$) available from Tokyo Chemical Industry Co., Ltd. is usable.

In terms of the water repellency imparting effect, R$^7$ in the general formula [3] is preferably an alkyl group of 1 to 4 carbon atoms in which a part or all of hydrogen atoms may be substituted with a fluorine atom. More preferably, R$^7$ is a methyl group or a trifluoromethyl group. A trifluoromethyl group is particularly preferable as R$^7$.

Further, R$^8$ in the general formula [3] are preferably three methyl groups in terms of the water repellency imparting effect.

The number of —OC(R$^7$)=NSi(R')$_g$(H)$_{3-g}$ groups as represented by 4-e-f in the general formula [3] is preferably 1 to facilitate uniform formation of the protective film.

To readily maintain the water repellency during the aftermentioned cleaning step after the formation of the protective film, f in the general formula [3] is preferably 0.

The combination of two methyl groups and one linear alkyl group is preferable as R$^6$ in the general formula [3] to facilitate uniform formation of the protective film.

More preferably, R$^6$ are three methyl groups.

Further, it is preferable that the surface treatment agent contains at least one kind of silicon compound (I-1) represented by the general formula [1] where a is 3; $R^2$ is a hydrogen atom; and $R^3$ is a fluorine-containing alkyl group of 1 to 6 carbon atoms and at least one kind of silicon compound (I-2) represented by the general formula [2] where c is 3; and $R^5$ is a fluorine-containing alkyl group of 1 to 6 carbon atoms so that, even when water is mixed into the surface treatment agent, the water repellency imparting effect on the surface of the workpiece is easily and stably maintained.

It is feasible to prepare the surface treatment agent by separately forming the silicon compounds (I-1) and (I-2) as raw materials and dissolving these silicon compounds together with the component (II) in the component (III), or by mixing raw materials for formation of the silicon compounds (I-1) and (I-2). For example, the surface treatment agent with the silicon compounds (I-1) and (I-2) can be obtained through the formation reaction of N-trimethylsilyltrifluoroacetamide as the silicon compound (I-1) and trimethylsilyltrifluoroacetate as the silicon compound (I-2) with the use of 1,1,1,3,3,3-hexamethyldisilazane and trifluoroacetic anhydride as raw materials.

The concentration of the component (I) is preferably 0.1 to 35 mass % based on 100 mass % of the total amount of the components (I) to (III) so as to facilitate uniform formation of the protective film on the surface of the workpiece. When the concentration of the component (I) is lower than 0.1 mass %, the water repellency imparting effect tends to become insufficient. When the concentration of the component (I) is higher than 35 mass %, the surface treatment agent may cause surface erosion of the workpiece or may remain as an impurity on the surface of the workpiece. Further, it is not favorable to use the component (I) at such a high concentration from the viewpoint of cost. The concentration of the component (I) is more preferably 0.5 to 30 mass %, still more preferably 1 to 20 mass %, yet more preferably 1 to 9 mass %.

Component (II)

The nitrogen-containing heterocyclic compound represented by the general formula [4], a nitrogen-containing heterocyclic compound represented by the general formula [5] and imidazole are used to promote the reaction of the —N($R^2$)C(=O)$R^3$ group of the silicon compound of the general formula [1], the —OC(=O)$R^5$ group of the silicon compound of the general formula [2] or the —OC($R^7$)=NSi($R^8$)$_g$(H)$_{3-g}$ group of the silicon compound of the general formula [3] with the surface of the workpiece. Each of these heterocyclic compounds itself may form a part of the protective film.

Preferably, the nitrogen-containing heterocyclic compound of the general formula [4] is of the kind where $R^9$ is a divalent hydrocarbon group of 3 carbon atoms; and $R^{10}$ is a divalent organic group consisting of carbon and/or nitrogen atoms and hydrogen atoms in which: the total number of carbon and nitrogen atoms is 3 to 5; and there may be present any carbon atom without constituting a cyclic structure. Further, it is preferable that the nitrogen-containing heterocyclic compound of the general formula [4] is liquid at 25° C. and 1 atmospheric pressure so as to suppress the generation of insoluble matter after preparation of the surface treatment agent. Specific examples of such a nitrogen-containing heterocyclic compound include 1,5-diazabicyclo[4.3.0]-5-nonene, 1,8-diazabicyclo[5.4.0]-7-undecene and 7-methyl-1,5,7-triazabicyclo[4.4.0]dec-5-ene.

The nitrogen-containing heterocyclic compound of general formula [4] can be commercially available. In terms of the ease of availability, 1,5-diazabicyclo[4.3.0]-5-nonene (available from e.g. Tokyo Chemical Industry Co., Ltd.), 1,8-diazabicyclo[5.4.0]-7-undecene (available from e.g. Tokyo Chemical Industry Co., Ltd.) and 7-methyl-1,5,7-triazabicyclo[4.4.0]dec-5-ene (available from e.g. Tokyo Chemical Industry Co., Ltd.) are suitably usable.

The nitrogen-containing heterocyclic compound of the general formula [5] is preferably of the kind where $R^{11}$ is an alkyl of 1 to 4 carbon atoms or a trimethylsilyl group; and $R^{12}$, $R^{13}$ and $R^{14}$ are hydrogen atoms. Specific examples of such a nitrogen-containing heterocyclic compound include N-methylimidazole, N-ethylimidazole, N-propylimidazole, N-butylimidazole and trimethylsilylimidazole.

It is preferable that the nitrogen-containing heterocyclic compound of the general formula [5] is liquid at 25° C. and 1 atmospheric pressure so as to suppress he generation of insoluble matter after preparation of the surface treatment agent. For example, there can be used N-methylimidazole, N-ethylimidazole, N-propylimidazole, N-butylimidazole, trimethylsilylimidazole or the like.

The nitrogen-containing heterocyclic compound of the general formula [5] and the imidazole can be commercially available. In terms of the ease of availability, imidazole (available from e.g. Tokyo Chemical Industry Co., Ltd.), N-methylimidazole (available from e.g. Tokyo Chemical Industry Co., Ltd.), N-ethylimidazole (available from e.g. Tokyo Chemical Industry Co., Ltd.), N-propylimidazole (available from e.g. Tokyo Chemical Industry Co., Ltd.), N-butylimidazole (available from e.g. Tokyo Chemical Industry Co., Ltd.) and trimethylsilylimidazole (available from e.g. Tokyo Chemical Industry Co., Ltd.) are suitably usable.

The concentration of the component (II) is preferably 0.05 to 10 mass % based on the total amount of the component (I) to (III) taken as 100 mass %. When the concentration of the component (II) is 0.05 mass % or higher, the reaction promoting effect (and, by extension, the water repellency imparting effect) can be easily exerted. When the concentration of the component (II) is 10 mass % or lower, it is favorable in that the surface treatment agent is unlikely to cause surface erosion of the workpiece or remain as an impurity on the surface of the workpiece. It is also favorable in that the surface treatment agent is unlikely to be heterogeneous without the component (II) being sufficiently dissolved. The concentration of the component (II) is more preferably 0.07 to 5 mass %, still more preferably 0.1 to 2 mass %.

Component (III): Organic Solvent

In the surface treatment agent, the organic solvent as the component (III) is used to dissolve therein the components (I) and (II). The use of the organic solvent in the surface treatment agent makes it easy to perform surface treatment on the workpiece by a spin coating method, an immersion method or the like.

There is no particular limitation on the kind of the organic solvent used as long as the organic solvent is capable of dissolving therein the components (I) and (II) and is unlikely to cause damage to the surface of the workpiece (e.g. substrate (inorganic pattern, organic pattern etc.)). A conventionally known organic solvent is usable.

As the organic solvent, there can suitably be used an aprotic solvent such as hydrocarbon, ester, ether, ketone, halogen-containing solvent, sulfoxide solvent, sulfone solvent, lactone solvent, carbonate solvent, OH-free polyol derivative, NH-free nitrogen-containing solvent, silicone solvent or terpene solvent, a thiol, or a mixture of two or more kinds thereof. Among others, the organic solvent is preferably a hydrocarbon, an ester, an ether, a halogen-containing solvent, a OH-free polyol derivative or a mixture of two or more kinds thereof so as to form the water-repellent protective film on the workpiece in a short time. In terms of the solubility of the components (I) and (II), it is preferable that the content of a nonpolar solvent in the organic solvent is as low as possible. It is particularly preferable that a nonpolar solvent is not used in the organic solvent.

Examples of the hydrocarbon include n-hexane, n-heptane, n-octane, n-nonane, n-decane, n-undecane, n-dodecane, n-tetradecane, n-hexadecane, n-octadecane, n-eicosane, branched hydrocarbons with corresponding carbon numbers (such as isododecane, isocetane etc.), cyclohexane, methylcyclohexane, decalin, benzene, toluene, xylene, (orth-, meta- or para-)diethylbenzene, 1,3,5-trimethylbenzene and naphthalene.

Examples of the ester include ethyl acetate, n-propyl acetate, i-propyl acetate, n-butyl acetate, i-butyl acetate, n-pentyl acetate, i-pentyl acetate, n-hexyl acetate, n-heptyl acetate, n-octyl acetate, n-pentyl formate, n-butyl propionate, ethyl butyrate, n-propyl butyrate, i-propyl butyrate, n-butyl butyrate, methyl n-octanoate, methyl decanoate, methyl pyruvate, ethyl pyruvate, n-propyl pyruvate, methyl acetoacetate, ethyl acetoacetate, ethyl 2-oxobutanoate, dimethyl adipate, methyl 3-methoxypropionate, ethyl 3-methoxypropionate, methyl 3-ethoxypropionate, ethyl 3-ethoxypropionate and ethyl ethoxyacetate.

Examples of the ether include di-n-propyl ether, ethyl n-butyl ether, di-n-butyl ether, ethyl n-amyl ether, di-n-amyl ether, ethyl n-hexyl ether, di-n-hexyl ether, di-n-octyl ether, ethers having branched hydrocarbon groups with corresponding carbon numbers such as diisopropyl ether, diisoamyl ether etc., dimethyl ether, diethyl ether, methyl ethyl ether, methyl cyclopentyl ether, diphenyl ether, tetrahydrofuran, dioxane, methyl perfluoropropyl ether, methyl perfluorobutyl ether, ethyl perfluorobutyl ether, methyl perfluorohexyl ether and ethyl perfluorohexyl ether.

Examples of the ketone include acetone, acetylacetone, methyl ethyl ketone, methyl propyl ketone, methyl butyl ketone, 2-heptanone, 3-heptanone, cyclohexanone and isophorone.

Examples of the halogen-containing solvent include: perfluorocarbons such as perfluorooctane, perfluorononane, perfluorocyclopentane, perfluorocyclohexane, hexafluorobenzene etc.; hydrofluorocarbons such as 1,1,1,3,3-pentafluorobutane, octafluorocyclopentane, 2,3-dihydrodecafluoropentane, Zeorora H (available from Zeon Corporation) etc.; hydrofluoroethers such as methyl perfluoroisobutyl ether, methyl perfluorobutyl ether, ethyl perfluorobutyl ether, ethyl perfluoroisobutyl ether, Asahiklin AE-3000 (available from Asahi Glass Co., Ltd.), Novec 7100, Novec 7200, Novec 7300 and Novec 7600 (each available from 3M Company) etc.; chlorocarbons such as tetrachloromethane etc.; hydrochlorocarbons such as chloroform etc.; chlorofluorocarbons such as dichlorodifluoromethane etc.; hydrochlorofluorocarbons such as 1,1-dichloro-2,2,3,3,3-pentafluoropropane, 1,3-dichloro-1,1,2,2,3-pentafluoropropane, 1-chloro-3,3,3-trifluoropropene, 1,2-dichloro-3,3,3-trifluoropropene etc.; perfluoroethers; and perfluoropolyethers.

Examples of the sulfoxide solvent include dimethyl sulfoxide.

Examples of the sulfone solvent include dimethyl sulfone, diethyl sulfone, bis(2-hydroxyethyl)sulfone and tetramethylene sulfone.

Example of the lactone solvent include β-propiolactone, γ-butyrolactone, γ-valerolactone, γ-hexanolactone, γ-heptanolactone, γ-octanolactone, γ-nonanolactone, γ-decanolactone, γ-undecanolactone, γ-dodecanolactone, δ-valerolactone, δ-hexanolactone, δ-octanolactone, δ-nonanolactone, δ-decanolactone, δ-undecanolactone, δ-dodecanolactone and ε-hexanolactone.

Examples of the carbonate solvent include dimethyl carbonate, ethyl methyl carbonate, diethyl carbonate and propylene carbonate.

Examples of the OH-free polyol derivative include ethylene glycol dimethyl ether, ethylene glycol diethyl ether, ethylene glycol dibutyl ether, ethylene glycol monomethyl ether acetate, ethylene glycol monoethyl ether acetate, ethylene glycol monobutyl ether acetate, ethylene glycol diacetate, diethylene glycol dimethyl ether, diethylene glycol ethyl methyl ether, diethylene glycol diethyl ether, diethylene glycol butyl methyl ether, diethylene glycol dibutyl ether, diethylene glycol monomethyl ether acetate, diethylene glycol monoethyl ether acetate, diethylene glycol monobutyl ether acetate, diethylene glycol diacetate, triethylene glycol dimethyl ether, triethylene glycol diethyl ether, triethylene glycol dibutyl ether, triethylene glycol butyl methyl ether, triethylene glycol monomethyl ether acetate, triethylene glycol monoethyl ether acetate, triethylene glycol monobutyl ether acetate, triethylene glycol diacetate, tetraethylene glycol dimethyl ether, tetraethylene glycol diethyl ether, tetraethylene glycol dibutyl ether, tetraethylene glycol monomethyl ether acetate, tetraethylene glycol monoethyl ether acetate, tetraethylene glycol monobutyl ether acetate, tetraethylene glycol diacetate, propylene glycol dimethyl ether, propylene glycol diethyl ether, propylene glycol dibutyl ether, propylene glycol monomethyl ether acetate, propylene glycol monoethyl ether acetate, propylene glycol monobutyl ether acetate, propylene glycol diacetate, dipropylene glycol dimethyl ether, dipropylene glycol methyl propyl ether, dipropylene glycol diethyl ether, dipropylene glycol dibutyl ether, dipropylene glycol monomethyl ether acetate, dipropylene glycol monoethyl ether acetate, dipropylene glycol monobutyl ether acetate, dipropylene glycol diacetate, tripropylene glycol dimethyl ether, tripropylene glycol diethyl ether, tripropylene glycol dibutyl ether, tripropylene glycol monomethyl ether acetate, tripropylene glycol monoethyl ether acetate, tripropylene glycol monobutyl ether acetate, tripropylene glycol diacetate, tetrapropylene glycol dimethyl ether, tetrapropylene glycol monomethyl ether acetate, tetrapropylene glycol diacetate, butylene glycol dimethyl ether, butylene glycol monomethyl ether acetate, butylene glycol diacetate, glycerin triacetate, 3-methoxybutyl acetate, 3-methyl-3-methoxybutyl acetate and 3-methyl-3-methoxybutyl propionate.

Examples of the NH-free nitrogen-containing solvent include N,N-dimethylformamide, N,N-dimethylacetamide, N,N-diethylacetamide, N-methyl-2-pyrrolidone, N-ethyl-2-pyrrolidone, N-propyl-2-pyrrolidone, 1,3-dimethyl-2-imidazolidone, 1,3-diethyl-2-imidazolidone, 1,3-diisopropyl-2-imidazolidone, triethylamine and pyridine.

Examples of the silicone solvent include hexamethyldisiloxane, octamethyltrisiloxane, decamethyltetrasiloxane and dodecamethylpentasiloxane.

Examples of the terpene solvent include p-menthane, diphenyl menthane, limonene, terpinene, bornane, norbornane and pinane.

Examples of the thiol include 1-hexanethiol, 2-methyl-1-pentanethiol, 3-methyl-1-pentanethiol, 4-methyl-1-pentanethiol, 2,2-dimethyl-1-butanethiol, 3,4-dimethyl-1-butanethiol, 2-ethyl-1-butanethiol, 1-heptanethiol, benzylthiol, 1-octanethiol, 2-ethyl-1-hexanethiol, 1-nonanethiol, 1-decanethiol, 1-undecanethiol, 1-dodecanethiol and 1-tridecanethiol.

In terms of the solubility of the components (I) and (II), it is preferable to use the OH-free polyalcohol derivative as the organic solvent. Examples of the OH-free polyalcohol derivative are those mentioned above. Among others, propylene glycol monoalkyl ether acetate is preferred in terms of the less environmental load. Particularly preferred is propylene glycol monomethyl ether acetate.

For further improvement in stability, the surface treatment agent according to the present disclosure may include additives such as a polymerization inhibitor, a chain transfer agent, an antioxidant and the like.

Further, it is preferable that the total amount of water in the starting raw materials of the surface treatment agent is 2000 mass ppm or less based on the total amount of the raw materials. When the total amount of water in the raw materials exceeds 2000 mass ppm, the effects of the silicon compound and the component (II) may be lowered so that it becomes difficult to form the protective film in a short time. For this reason, it is preferable that the total amount of water in the raw materials of the surface treatment agent is as small as possible. The total amount of water in the raw materials of the surface treatment agent is more preferably 500 mass ppm or less, still more preferably 200 mass ppm or less. Due to the fact that the larger the amount of water present, the more likely the storage stability of the surface treatment agent is to be deteriorated, it is preferable that the total amount of water is small. The total amount of water in the raw materials of the chemical liquid is particularly preferably 100 mass ppm or less, more particularly preferably 50 mass ppm or less. Although it is preferable that the total amount of water in the raw materials of the chemical liquid is as small as possible, the total amount of water in the raw materials of the chemical liquid may be 0.1 mass ppm or more as long as within the above range. Consequently, it is preferable that the silicon compound, the component (II) and the organic solvent are low in water content.

It is also preferable that, in a particle measurement made in a liquid phase of the surface treatment agent by a light scattering type in-liquid particle detector, the number of particles of diameter larger than 0.2 μm is 100 or less per 1 mL of the surface treatment agent. When the number of particles of diameter larger than 0.2 μm exceeds 100 per 1 mL of the surface treatment agent, there unfavorably occurs a risk of damage to the workpiece by the particles. This can lead to a deterioration in device yield and reliability. When the number of particles of diameter larger than 0.2 μm is 100 or less per 1 mL of the surface treatment agent, it is favorably possible to omit or reduce the cleaning of the workpiece surface with a solvent or water after the formation of the protective film. Although it is preferable that the number of particles of diameter larger than 0.2 μm in the surface treatment agent is as less as possible, the number of particles of diameter larger than 0.2 μm may be 1 or more per 1 mL of the surface treatment agent as long as within the above range. In the present disclosure, the particle measurement in the liquid phase of the surface treatment agent can be made by a commercially available measurement device on the basis of a laser light scattering type in-liquid particle measuring method using a laser as a light source. The particle diameter means a light scattering equivalent diameter with reference to a PSL (polystyrene latex) standard particle.

Herein, the term "particles" include not only particles such as dust, dirt, organic solid matter and inorganic solid matter contained as impurities in the raw materials, but also particles such as dust, dirt, organic solid matter and inorganic solid matter introduced as contaminants during preparation of the surface treatment agent, and refer to particles finally present without being dissolved in the surface treatment agent.

Furthermore, it is preferable that the amount of respective Na, Mg, K, Ca, Mn, Fe, Cu, Li, Al, Cr, Ni, Zn and Ag elements (as metal impurity elements) in the surface treatment agent is 0.1 mass ppb or less based on the total amount of the surface treatment agent. When the amount of the metal impurity element in the surface treatment agent exceeds 0.1 mass ppb based on the total amount of the surface treatment agent, there unfavorably occurs a risk of increase in device junction leakage current. This can lead to a deterioration in device yield and reliability. When the amount of the metal impurity element in the surface treatment agent is 0.1 mass ppb or less based on the total amount of the surface treatment agent, it is favorably possible to omit or reduce the cleaning of the workpiece surface (that is, the surface of the protective film) with a solvent or water after the formation of the protective film. For this reason, it is preferable that the amount of the metal impurity elements in the surface treatment agent is as small as possible. The amount of the metal impurity element in the surface treatment agent may however be 0.001 mass ppb or more as long as within the above range.

2. Manufacturing Method of Surface-Treated Body

A manufacturing method of a surface-treated body according to the present disclosure includes performing surface treatment on a surface of a workpiece by bringing the surface treatment agent according to the present disclosure into contact with the surface of the workpiece.

The surface of the workpiece to be subjected to the surface treatment according to the present disclosure refers to a surface of a substrate itself, a surface of an inorganic pattern or resin pattern formed on the substrate, or a surface of an unpatterned inorganic layer or resin layer formed on the substrate.

In the manufacturing method of the surface-treated body according to the present disclosure, the surface-treated body is obtained through silylation of the surface of the workpiece. The silylation can be for any purpose. Typical purposes of the silylation are to: (1) impart hydrophobicity to the surface of the workpiece such as substrate and improve the adhesion of the substrate to the resin pattern formed of e.g. photoresist; and (2) prevent the occurrence of a pattern collapse in the inorganic pattern or resin pattern on the surface of the substrate.

For the above purpose (1), there can be used without particular limitation any conventionally known method of bringing the surface treatment agent according to the present disclosure into contact with the surface of the workpiece. For example, it is feasible to vaporize the surface treatment agent according to the present disclosure and bring the resulting vapor into contact with the surface of the workpiece, or feasible to bring the surface treatment agent according to the present disclosure into contact with the surface of the workpiece by a spin coating method, an immersion method or the like.

In the case where the workpiece is a substrate used for formation of a photoresist film as an organic layer, the surface treatment agent is brought into contact with the substrate before the formation of the organic layer.

By such treatment operation, the surface of the workpiece is silylated whereby the hydrophobicity of the surface of the workpiece is increased. In the case where the substrate is used as the workpiece and treated with the surface treatment agent, the surface of the substrate is made hydrophobic so that the adhesion of the substrate to e.g. the photoresist is improved.

For the above purpose (2), it is feasible to bring the surface treatment agent according to the present disclosure into contact with the surface of the substrate as the workpiece prior to a cleaning process after the formation of the inorganic pattern or resin pattern.

After the formation of the inorganic pattern on the surface of the substrate, it is common to clean the surface of the pattern with a water-based cleaning liquid such as SPM (sulfuric hydrogen/hydrogen peroxide mixture) or APM (ammonia/hydrogen peroxide mixture). After this cleaning operation, the substrate surface may be further cleaned by replacing the water-based cleaning liquid retained on the substrate surface with a cleaning liquid different from the water-based cleaning liquid (hereinafter referred to as "cleaning liquid A"). The cleaning liquid A refers to an organic solvent, a mixture of the organic solvent and a water-based cleaning liquid, or a cleaning liquid in which at least one kind selected from acid, alkali and surfactant is admixed with the organic solvent or the mixture of the organic solvent and the water-based cleaning liquid.

Further, it is common to clean away the development residue or the adhered developer by a cleaning liquid such as water or surfactant rinse after the formation of the resin pattern on the surface of the substrate.

There is no particular limitation on the cleaning process (surface treatment process) of the substrate as long as the process is performed by means of a cleaning machine capable of retaining the surface treatment agent in liquid form or cleaning liquid on the surface of the substrate. It is feasible to adopt a single-substrate processing method using a spin cleaner in which substrates are cleaned one by one by rotating the substrate in a nearly horizontal position while supplying the liquid to the vicinity of the rotation center, or a batch processing method using a cleaning machine in which a plurality of substrates are cleaned together by immersion in the liquid within a cleaning chamber. There is also no particular limitation on the form of the surface treatment agent or cleaning liquid supplied to the surface of the substrate as long as the surface treatment agent or cleaning liquid is in a liquid state when retained on the substrate surface. The surface treatment agent or cleaning liquid can be supplied in e.g. liquid form, vapor form or the like.

Examples of the organic solvent preferably usable as the cleaning liquid A include hydrocarbons, esters, ethers, ketones, halogen-containing solvents, sulfoxide-based solvents, lactone-based solvents, carbonate-based solvents, alcohols, polyol derivatives and nitrogen-containing solvents.

The surface treatment agent according to the present disclosure is used by replacing the water-based cleaning liquid or the cleaning liquid A with the surface treatment agent. The replaced surface treatment agent may be replaced with a cleaning liquid different from the surface treatment agent (hereinafter referred to as "cleaning liquid B").

After the cleaning of the substrate with the water-based cleaning liquid or the cleaning liquid A, the cleaning liquid is replaced with the surface treatment agent in liquid form. While the surface treatment agent is retained on the substrate, the protective film is formed on the surface of the substrate. In the present disclosure, the protective film is not necessarily continuously formed and is not necessarily uniformly formed. It is however preferable that the protective film is continuously and uniformly formed to impart higher water repellency. The time during which the surface treatment agent is retained on the substrate is preferably 1 to 120 seconds.

As the temperature of the surface treatment agent is increased, it becomes easy to form the protective film in a shorter time. The temperature at which the uniform protective film can be easily formed is higher than or equal to 10° C. and lower than a boiling point of the surface treatment agent. In particular, it is preferable to retain the surface treatment agent at a temperature higher than or equal to 15° C. and lower than or equal to a temperature 10° C. lower than the boiling point of the surface treatment agent. It is further preferable to maintain the temperature of the surface treatment agent at the above-mentioned temperature range during the time when the chemical liquid is retained on the substrate. Herein, the boiling point of the surface treatment agent refers to a boiling point of any component present in the largest amount by mass ratio among the components of the surface treatment agent.

After the formation of the protective film, the substrate surface may be subjected to drying operation after the liquid surface treatment agent remaining on the substrate surface is replaced with the cleaning liquid B. The cleaning liquid B refers to a water-based cleaning liquid, an organic solvent, a mixture of the organic solvent and the water-based cleaning liquid, a cleaning liquid in which at least one kind selected from acid, alkali and surfactant is admixed with the organic solvent or the mixture of the organic solvent and the water-based cleaning liquid, or a mixture thereof with the surface treatment agent. For removal of particles and metal impurities, the cleaning liquid B is preferably water, an organic solvent, or a mixture of water and an organic solvent.

Examples of the organic solvent preferably usable as the cleaning liquid B include hydrocarbons, esters, ethers, ketones, halogen-containing solvents, sulfoxide-based solvents, alcohols, polyol derivatives and nitrogen-containing solvents.

When the organic solvent is used in the cleaning liquid B, there is a case that the water repellency of the protective film which has been formed from the surface treatment agent on the substrate surface is unlikely to be deteriorated by the cleaning of the substrate surface with the cleaning liquid B.

By the formation of the protective film on the substrate surface, the water repellency is imparted to the substrate surface. The protective film is held on the substrate surface even when the liquid is removed from the substrate surface.

It is herein assumed that, in a state where the protective film has been formed on the substrate surface, water is retained on the substrate surface. In this case, the contact angle of the water to the substrate surface is preferably 85 to 1300 so as to ensure the adhesion of the substrate to the resin pattern formed of e.g. photoresist and suppress the occurrence of a pattern collapse. The contact angle is more preferably 90 to 130°.

The liquid retained on the substrate surface on which the protective film has been formed from the surface treatment agent is removed by the drying operation. The liquid retained on the substrate surface may be the surface treatment agent, the cleaning liquid B or a mixed liquid thereof. The mixed liquid is a mixture of the surface treatment agent and the cleaning liquid B or a liquid in which the components of the surface treatment agent are contained at lower concentrations than those in the surface treatment agent. In other words, the mixed liquid may be a liquid in the middle of replacing the surface treatment agent with the cleaning liquid B or may be a liquid prepared in advance by mixing the components (I) to (III) with the cleaning liquid B. In terms of the cleanliness of the substrate surface, water, the organic solvent or a mixture thereof is preferred. After the liquid is once removed from the substrate surface, the cleaning liquid B may be retained on the substrate surface and then removed by drying operation.

In the case where the substrate surface is cleaned with the cleaning liquid B after the formation of the protective film, the cleaning time, that is, the time of retaining the cleaning liquid B on the substrate surface is preferably 1 to 60 seconds for removal of particles and impurities from the substrate surface. In terms of the water repellency maintaining effect of the protective film on the substrate surface, there is a tendency that the water repellency of the substrate surface can be easily maintained even after the cleaning process when the organic solvent is used as the cleaning liquid B.

By the drying operation, the liquid retained on the substrate surface is removed. It is preferable to perform the drying operation by a known drying process such as spin drying, IPA (2-propanol) steam drying, Marangoni drying, heat drying, hot-air drying, air-blow drying or vacuum drying.

The protective film may be removed after the drying operation. For removal of the water-repellent protective film, it is effective to cleave C—C bond and C—F bond in the water-repellent protective film. There is no particular limitation on the bond cleavage technique as long as it is capable of cleaving the above-mentioned bond. For example, the protective film can be removed by treating the substrate surface with light irradiation, heating, ozone exposure, plasma irradiation, corona discharge etc.

In the case where the protective film is removed by light irradiation, it is preferable to irradiate the substrate surface with an ultraviolet light of wavelengths shorter than 340 nm and 240 nm which respectively correspond to 83 kcal/mol and 116 kcal/mol, i.e., the bond energies of C—C bond and C—F bond in the protective film. As a light source, there can be used a metal halide lamp, a low-pressure mercury lamp, a high-pressure mercury lamp, an excimer lamp, a carbon arc lamp or the like. In the case of using a metal halide lamp as the light source, the irradiation intensity of the ultraviolet light is preferably 100 mW/cm$^2$ or higher, more preferably 200 mW/cm$^2$ or higher, as measured by an illuminometer (such as an irradiation intensity meter UM-10 manufactured by Konica Minolta Sensing, Inc. with a light receptor UM-360 [peak sensitivity wavelength: 365 nm, measurement wavelength range: 310 to 400 nm]). When the irradiation intensity is lower than 100 mW/cm$^2$, it takes a long time to remove the protective film. It is preferable to use the low-pressure mercury lamp because the low-pressure mercury lamp enables irradiation of the substrate surface with an ultraviolet light of shorter wavelengths so as to, even though the irradiation intensity is low, remove the protective film in a short time.

In the case where the protective film is removed by light irradiation, it is preferable to generate ozone in parallel with decomposing components of the protective film by irradiation with an ultraviolet light and induce oxidation volatilization of the components of the protective film by the ozone for shortening of the treatment time. As a light source, there can be used a low-pressure mercury lamp, an excimer lamp or the like. The wafer may be heated while being subjected to light irradiation. As a light source, there can be used a low-pressure mercury lamp, an excimer lamp or the like. The substrate may be heated while being subjected to light irradiation.

In the case where the protective film is removed by heating, the heating temperature of the substrate is preferably 400 to 1000° C., more preferably 500 to 900° C.; and the heating time of the substrate is preferably 10 seconds to 60 minutes, more preferably 30 seconds to 10 minutes. The heating may be performed in combination with ozone exposure, plasma irradiation, corona discharge or the like. The substrate may be subjected to light irradiation while heating.

As the method of removing the protective film by heating, it is feasible to bring the substrate into a heat source or place the substrate in a heated atmosphere such as heat treatment furnace. The placement of the substrate in the heated atmosphere is industrially advantageous in terms of easy operation, short treatment time and high treatment capability due to the fact that, even in the case of treating a plurality of substrates, the energy for removal of the protective film can be easily uniformly applied to the respective substrates by placing the substrates in the heated atmosphere.

In the case where the protective film is removed by ozone exposure, it is preferable to supply the substrate surface with ozone generated by ultraviolet radiation from a low-pressure mercury lamp etc., low-temperature discharge under high voltage application, or the like. The substrate may be subjected to light irradiation or heating while being exposed to ozone.

The protective film on the substrate surface can be efficiently removed by any combination of the light irradiation treatment, the heating treatment, the ozone exposure treatment, the plasma irradiation treatment and the corona discharge treatment.

EXAMPLES

The present disclosure will be described in more detail below by way of the following experimental examples. It should however be understood that the present disclosure is not limited to these experimental examples.

The following experimental examples of the present disclosure were each carried out to evaluate the ease of dissolution of raw materials during preparation of a surface treatment agent and the water repellency imparting effect exerted by the surface treatment of a workpiece (hereinafter simply referred to as "wafer") with the surface treatment agent. In the respective Examples and Comparative Examples, water, known as a typical water-based cleaning liquid, was used as a liquid brought into contact with a surface of the wafer for contact angle measurement.

In the case of a wafer having a finely unevenly patterned surface, however, it is not possible to exactly evaluate the angle of contact of water with a protective film itself formed on the unevenly patterned surface of the wafer.

The contact angle of a water drop is generally evaluated by dropping several microliters of water on a surface of a sample (substrate) and measuring an angle between the water drop and the substrate surface according to JIS R 3257 "Testing Method of Wettability of Glass Substrate Surface". In the case of the wafer having the pattern, the contact angle is enormously large. This is due to the Wenzel's effect or Cassie's effect by which the apparent contact angle of the water drop becomes increased under the influence of the surface shape (roughness) of the substrate on the contact angle.

In view of the above facts, each of Examples and Comparative Examples was carried out by providing a wafer with a smooth surface, supplying a surface treatment agent to the smooth surface of the wafer to form a protective film on the wafer surface, and then, making various evaluations on the assumption of the thus-formed protective film as a protective film formed on an unevenly patterned surface of a wafer. In each of Examples and Comparative Examples, a silicon wafer having a smooth surface coated with a $SiO_2$ layer, called a "$SiO_2$-coated wafer", was used as the wafer with the smooth surface.

Hereinafter, explanations will be given of methods for evaluations, a method for preparing a surface treatment agent, a method of manufacturing a surface-treated body with the use of a surface treatment agent, and results of evaluations.

(A) Dissolution Time of Raw Materials during Preparation of Surface Treatment Agent Raw materials for preparation of a surface treatment agent were mixed together under a condition that the liquid temperature was maintained at 25° C. The time of stirring until dissolution of the whole raw materials (i.e. dissolution time) was measured by visual inspection. As a matter of course, it is preferable that the dissolution time is shorter because the shorter the dissolution, the easier it is to dissolve the raw materials.

The dissolution time was judged as being at a satisfactory level when the raw materials were dissolved by stirring within 30 seconds at 25° C. In the following tables, the dissolution time was evaluated as "○" in the case where the raw materials were dissolved by stirring during a time period more than 5 seconds and less than or equal to 30 seconds. In the case where the raw materials were dissolved by stirring within 5 seconds, the dissolution time was evaluated as "⊚" upon judging that the solubility was very high.

On the other hand, the dissolution time was evaluated as "Δ" in the case where, even though the raw materials were dissolved with continuation of stirring, it took more than 30 seconds to dissolve the raw materials. The dissolution time was evaluated as "X" in the case where it was impossible to dissolve the raw materials even by stirring for 1 hour or more. The dissolution time was judged as being at an unsatisfactory level in these cases.

(B) Contact Angle relative to Protective Film on Wafer Surface

About 2 μl of pure water was dropped on a surface of a wafer on which a protective film was formed. Then, the angle between the water drop and the wafer surface (as a contact angle) was measured with a contact angle meter (manufactured by Kyowa Interface Science Co., Ltd.: CA-X Model). The contact angle was judged as being at a satisfactory level when it was 85 or larger.

Example 1

(1) Preparation of Surface Treatment Agent

Raw materials of a surface treatment agent, that is, N-methyl-N-trimethylsilyltrifluoroacetamide $((CH_3)_3SiN(CH_3)C(=O)CF_3$; available from Tokyo Chemical Industry Co., Ltd.; hereinafter also referred to as "MSTFA") as the component (I), imidazole (available from Tokyo Chemical Industry Co., Ltd.; hereinafter also referred to as "Im") as the component (II) and propylene glycol monomethyl ether acetate (available from Tokyo Chemical Industry Co., Ltd.; hereinafter also referred to as "PGMEA") as the organic solvent (III) were mixed at concentrations shown in TABLE 1 while the temperature of the resulting liquid mixture was maintained at 25° C. As the whole raw materials were dissolved by stirring for about 15 seconds, there was obtained the surface treatment agent in solution form.

(2) Cleaning of Silicon Wafer

A silicon wafer with a smooth thermal oxide film (more specifically, a silicon wafer having on a surface thereof a thermal oxide film of 1 μm thickness), regarded as a workpiece after the formation of a pattern by an etching process, was immersed in an aqueous solution of 1 mass % hydrogen fluoride at room temperature for 10 minutes, immersed in pure water at room temperature for 1 minute and then immersed in 2-propanol (iPA) at room temperature for 1 minute.

(3) Surface Treatment of Silicon Wafer with Surface Treatment Agent

After the above cleaning, the silicon wafer was immersed in the surface treatment agent at room temperature for 20 seconds. The surface treatment agent used was that prepared in the above section "(1) Preparation of Surface Treatment Agent". The silicon wafer was then immersed in iPA at room temperature for 1 minute. Finally, the silicon wafer was taken out from the iPA and dried by air blowing to remove the iPA from the surface of the silicon wafer.

The evaluation test was conducted according to the procedure mentioned in the above section (B). As shown in TABLE 1, the contact angle after the surface treatment was 86°. Thus, the surface treatment agent had a good water repellency imparting effect.

TABLE 1

| | Composition of Surface Treatment Agent | | | | | | | Evaluation Results | |
|---|---|---|---|---|---|---|---|---|---|
| | (I) | | | (II) | | | | | |
| | | Concentration of Component (I) Based on Total Amount of Components (I) to (III) | | | | Concentration of Component (II) Based on Total Amount of Components (I) to (III) | | | (B) |
| | Kind | [mass %] | [mmol/ 100 g] | Kind | Form at 25° C. and 1 atm. | [mass %] | [mmol/ 100 g] | (III) Organic Solvent | (A) Dissolution time | Contact Angle [°] |
| Ex. 1 | MSTFA | 6.0 | 30.2 | Im | solid | 0.2 | 2.4 | PGMEA | ○ | 86 |
| Ex. 2 | MSTFA | 6.0 | 30.2 | N-MeIm | liquid | 0.2 | 2.4 | PGMEA | ⊚ | 94 |
| Ex. 3 | MSTFA | 6.0 | 30.2 | N-EtIm | liquid | 0.2 | 2.4 | PGMEA | ⊚ | 94 |
| Ex. 4 | MSTFA | 6.0 | 30.2 | N-BuIm | liquid | 0.3 | 2.4 | PGMEA | ⊚ | 94 |
| Ex. 5 | MSTFA | 6.0 | 30.2 | DBN | liquid | 0.3 | 2.4 | PGMEA | ⊚ | 94 |
| Ex. 6 | MSTFA | 6.0 | 30.2 | DBU | liquid | 0.4 | 2.4 | PGMEA | ⊚ | 94 |

TABLE 1-continued

| | Composition of Surface Treatment Agent | | | | | | | Evaluation Results | |
|---|---|---|---|---|---|---|---|---|---|
| | (I) | | | (II) | | | | | |
| | | Concentration of Component (I) Based on Total Amount of Components (I) to (III) | | | Form at 25° C. and 1 atm. | Concentration of Component (II) Based on Total Amount of Components (I) to (III) | | (III) | (A) | (B) |
| | Kind | [mass %] | [mmol/ 100 g] | Kind | | [mass %] | [mmol/ 100 g] | Organic Solvent | Dissolution time | Contact Angle [°] |
| Ex. 7 | MSTFA | 6.0 | 30.2 | MTBD | liquid | 0.4 | 2.4 | PGMEA | ⊚ | 94 |
| Ex. 8 | MSTFA | 6.0 | 30.2 | TMS-Im | liquid | 0.3 | 2.4 | PGMEA | ⊚ | 94 |
| Ex. 9 | TMS-TFA | 5.6 | 30.2 | Im | solid | 0.2 | 2.4 | PGMEA | ○ | 94 |
| Ex. 10 | TMS-TFA | 5.6 | 30.2 | N-MeIm | liquid | 0.2 | 2.4 | PGMEA | ⊚ | 94 |
| Ex. 11 | TMS-TFA | 5.6 | 30.2 | N-EtIm | liquid | 0.2 | 2.4 | PGMEA | ⊚ | 94 |
| Ex. 12 | TMS-TFA | 5.6 | 30.2 | N-BuIm | liquid | 0.3 | 2.4 | PGMEA | ⊚ | 94 |
| Ex. 13 | TMS-TFA | 5.6 | 30.2 | DBN | liquid | 0.3 | 2.4 | PGMEA | ⊚ | 94 |
| Ex. 14 | TMS-TFA | 5.6 | 30.2 | DBU | liquid | 0.4 | 2.4 | PGMEA | ⊚ | 94 |
| Ex. 15 | TMS-TFA | 5.6 | 30.2 | MTBD | liquid | 0.4 | 2.4 | PGMEA | ⊚ | 94 |
| Ex. 16 | TMS-TFA | 5.6 | 30.2 | TMS-Im | liquid | 0.3 | 2.4 | PGMEA | ⊚ | 94 |
| Ex. 17 | BSTFA | 7.8 | 30.2 | DBN | liquid | 0.3 | 2.4 | PGMEA | ⊚ | 94 |
| Ex. 18 | BSTFA | 7.8 | 30.2 | DBU | liquid | 0.4 | 2.4 | PGMEA | ⊚ | 96 |
| Ex. 19 | BSTFA | 7.8 | 30.2 | MTBD | liquid | 0.4 | 2.4 | PGMEA | ⊚ | 89 |
| Comp. Ex. 1 | MSTFA | 6.0 | 30.2 | Tet | solid | 0.2 | 2.4 | PGMEA | Δ | 71 |
| Comp. Ex. 2 | MSTFA | 6.0 | 30.2 | 5-MeTet | solid | 0.2 | 2.4 | PGMEA | Δ | 61 |
| Comp. Ex. 3 | MSTFA | 6.0 | 30.2 | Tri | solid | 0.2 | 2.4 | PGMEA | X | 41 |
| Comp. Ex. 4 | MSTFA | 6.0 | 30.2 | BzoTri | solid | 0.3 | 2.4 | PGMEA | Δ | 48 |
| Comp. Ex. 5 | MSTFA | 6.0 | 30.2 | Pyr | solid | 0.2 | 2.4 | PGMEA | ○ | 45 |
| Comp. Ex. 6 | MSTFA | 6.0 | 30.2 | 2-MeIm | solid | 0.2 | 2.4 | PGMEA | Δ | 72 |
| Comp. Ex. 7 | MSTFA | 6.0 | 30.2 | 4-MeIm | solid | 0.2 | 2.4 | PGMEA | Δ | 85 |
| Comp. Ex. 8 | MSTFA | 6.0 | 30.2 | TFAcIm | liquid | 0.4 | 2.4 | PGMEA | ⊚ | 80 |
| Comp. Ex. 9 | MSTFA | 6.0 | 30.2 | 3-Mer-1,2,4-Tri | solid | 0.3 | 2.4 | PGMEA | Δ | 11 |
| Comp. Ex. 10 | MSTFA | 6.0 | 30.2 | 5-MeBzoTri | solid | 0.3 | 2.4 | PGMEA | Δ | 31 |
| Comp. Ex. 11 | MSTFA | 6.0 | 30.2 | 5-AminoTet | solid | 0.2 | 2.4 | PGMEA | X | 65 |
| Comp. Ex. 12 | MSTFA | 6.0 | 30.2 | Tet-1-AcOH | solid | 0.3 | 2.4 | PGMEA | Δ | 20 |
| Comp. Ex. 13 | MSTFA | 6.0 | 30.2 | Tet-5-AcOH | solid | 0.3 | 2.4 | PGMEA | Δ | 65 |
| Comp. Ex. 14 | MSTFA | 6.0 | 30.2 | 5-Mer-1-MeTet | solid | 0.3 | 2.4 | PGMEA | Δ | 43 |
| Comp. Ex. 15 | MSTFA | 6.0 | 30.2 | 5-BnTet | solid | 0.4 | 2.4 | PGMEA | Δ | 65 |
| Comp. Ex. 16 | MSTFA | 6.0 | 30.2 | 5-PhTet | solid | 0.4 | 2.4 | PGMEA | Δ | 77 |
| Comp. Ex. 17 | MSTFA | 6.0 | 30.2 | 5-pTolTet | solid | 0.4 | 2.4 | PGMEA | X | 75 |
| Comp. Ex. 18 | MSTFA | 6.0 | 30.2 | 5-Mer-1-PhTet | solid | 0.4 | 2.4 | PGMEA | Δ | 52 |
| Comp. Ex. 19 | MSTFA | 6.0 | 30.2 | 5-MeThiTet | solid | 0.3 | 2.4 | PGMEA | Δ | 71 |
| Comp. Ex. 20 | MSTFA | 6.0 | 30.2 | Sac | solid | 0.5 | 2.4 | PGMEA | Δ | 47 |
| Comp. Ex. 21 | MSTFA | 6.0 | 30.2 | iOx | liquid | 0.2 | 2.4 | PGMEA | ⊚ | 51 |
| Comp. Ex. 22 | TMS-TFA | 5.6 | 30.2 | Tet | solid | 0.2 | 2.4 | PGMEA | Δ | 12 |
| Comp. Ex. 23 | TMS-TFA | 5.6 | 30.2 | 5-MeTet | solid | 0.2 | 2.4 | PGMEA | Δ | 11 |
| Comp. Ex. 24 | TMS-TFA | 5.6 | 30.2 | Tri | solid | 0.2 | 2.4 | PGMEA | X | 48 |
| Comp. Ex. 25 | TMS-TFA | 5.6 | 30.2 | BzoTri | solid | 0.3 | 2.4 | PGMEA | Δ | <10 |
| Comp. Ex. 26 | TMS-TFA | 5.6 | 30.2 | Pyr | solid | 0.2 | 2.4 | PGMEA | ○ | 39 |
| Comp. Ex. 27 | TMS-TFA | 5.6 | 30.2 | 2-MeIm | solid | 0.2 | 2.4 | PGMEA | Δ | 83 |
| Comp. Ex. 28 | TMS-TFA | 5.6 | 30.2 | 4-MeIm | solid | 0.2 | 2.4 | PGMEA | Δ | 87 |
| Comp. Ex. 29 | TMS-TFA | 5.6 | 30.2 | TFAcIm | liquid | 0.4 | 2.4 | PGMEA | ⊚ | 48 |
| Comp. Ex. 30 | TMS-TFA | 5.6 | 30.2 | 3-Mer-1,2,4-Tri | solid | 0.3 | 2.4 | PGMEA | Δ | 12 |
| Comp. Ex. 31 | TMS-TFA | 5.6 | 30.2 | 5-MeBzoTri | solid | 0.3 | 2.4 | PGMEA | Δ | <10 |
| Comp. Ex. 32 | TMS-TFA | 5.6 | 30.2 | 5-AminoTet | solid | 0.2 | 2.4 | PGMEA | X | 22 |
| Comp. Ex. 33 | TMS-TFA | 5.6 | 30.2 | Tet-1-AcOH | solid | 0.3 | 2.4 | PGMEA | Δ | <10 |
| Comp. Ex. 34 | TMS-TFA | 5.6 | 30.2 | Tet-5-AcOH | solid | 0.3 | 2.4 | PGMEA | X | <10 |
| Comp. Ex. 35 | TMS-TFA | 5.6 | 30.2 | 5-Mer-1-MeTet | solid | 0.3 | 2.4 | PGMEA | Δ | <10 |
| Comp. Ex. 36 | TMS-TFA | 5.6 | 30.2 | 5-BnTet | solid | 0.4 | 2.4 | PGMEA | Δ | <10 |
| Comp. Ex. 37 | TMS-TFA | 5.6 | 30.2 | 5-PhTet | solid | 0.4 | 2.4 | PGMEA | Δ | 11 |
| Comp. Ex. 38 | TMS-TFA | 5.6 | 30.2 | 5-pTolTet | solid | 0.4 | 2.4 | PGMEA | X | <10 |
| Comp. Ex. 39 | TMS-TFA | 5.6 | 30.2 | 5-Mer-t-PhTet | solid | 0.4 | 2.4 | PGMEA | Δ | 11 |
| Comp. Ex. 40 | TMS-TFA | 5.6 | 30.2 | 5-MeThiTet | solid | 0.3 | 2.4 | PGMEA | Δ | <10 |

TABLE 2

Composition of Surface Treatment Agent

| | | (I) | | | (II) | | | | Evaluation Results | |
|---|---|---|---|---|---|---|---|---|---|---|
| | | | Concentration of Component (I) Based on Total Amount of Components (I) to (III) | | | | Concentration of Component (I) Based on Total Amount of Components (I) to (III) | (III) | (A) | (B) |
| | Kind | [mass %] | [mmol/ 100 g] | Kind | Form at 25° C. and 1 atm. | [mass %] | [mmol/ 100 g] | Organic Solvent | Dissolution Time | Contact Angle [°] |
| Comp. Ex. 41 | TMS-TFA | 6.0 | 30.2 | Sac | solid | 0.5 | 2.4 | PGMEA | Δ | <10 |
| Comp. Ex. 42 | TMS-TFA | 5.6 | 30.2 | iOx | liquid | 0.2 | 2.4 | PGMEA | ◎ | 11 |
| Comp. Ex. 43 | BSTFA | 7.8 | 30.2 | Tet | solid | 0.2 | 2.4 | PGMEA | Δ | 76 |
| Comp. Ex. 44 | BSTFA | 7.8 | 30.2 | 5-MeTet | solid | 0.2 | 2.4 | PGMEA | Δ | 77 |
| Comp. Ex. 45 | BSTFA | 7.8 | 30.2 | Tri | solid | 0.2 | 2.4 | PGMEA | Δ | 60 |
| Comp. Ex. 46 | BSTFA | 7.8 | 30.2 | BzoTri | solid | 0.3 | 2.4 | PGMEA | Δ | 50 |
| Comp. Ex. 47 | BSTFA | 7.8 | 30.2 | Pyr | solid | 0.2 | 2.4 | PGMEA | ○ | 38 |
| Comp. Ex. 48 | BSTFA | 7.8 | 30.2 | 2-MeIm | solid | 0.2 | 2.4 | PGMEA | Δ | 57 |
| Comp. Ex. 49 | BSTFA | 7.8 | 30.2 | 4-MeIm | solid | 0.2 | 2.4 | PGMEA | Δ | 73 |
| Comp. Ex. 50 | BSTFA | 7.8 | 30.2 | TFAcIm | liquid | 0.4 | 2.4 | PGMEA | ◎ | 17 |
| Comp. Ex. 51 | BSTFA | 7.8 | 30.2 | 3-Mer-1,2,4-Tri | solid | 0.3 | 2.4 | PGMEA | X | <10 |
| Comp. Ex. 52 | BSTFA | 7.8 | 30.2 | 5-MeBzoTri | solid | 0.3 | 2.4 | PGMEA | Δ | 60 |
| Comp. Ex. 53 | BSTFA | 7.8 | 30.2 | 5-AminoTet | solid | 0.2 | 2.4 | PGMEA | X | 75 |
| Comp. Ex. 54 | BSTFA | 7.8 | 30.2 | Tet-1-AcOH | solid | 0.3 | 2.4 | PGMEA | Δ | 16 |
| Comp. Ex. 55 | BSTFA | 7.8 | 30.2 | Tet-5-AcOH | solid | 0.3 | 2.4 | PGMEA | X | 66 |
| Comp. Ex. 56 | BSTFA | 7.8 | 30.2 | 5-Mer-1-MeTet | solid | 0.3 | 2.4 | PGMEA | Δ | 16 |
| Comp. Ex. 57 | BSTFA | 7.8 | 30.2 | 5-BnTet | solid | 0.4 | 2.4 | PGMEA | Δ | 64 |
| Comp. Ex. 58 | BSTFA | 7.8 | 30.2 | 5-PhTet | solid | 0.4 | 2.4 | PGMEA | Δ | 72 |
| Comp. Ex. 59 | BSTFA | 7.8 | 30.2 | 5-pTolTet | solid | 0.4 | 2.4 | PGMEA | X | 78 |
| Comp. Ex. 60 | BSTFA | 7.8 | 30.2 | 5-Mer-1-PhTet | solid | 0.4 | 2.4 | PGMEA | Δ | 12 |
| Comp. Ex. 61 | BSTFA | 7.8 | 30.2 | 5-MeThiTet | solid | 0.3 | 2.4 | PGMEA | Δ | 59 |
| Comp. Ex. 62 | BSTFA | 7.8 | 30.2 | Sac | solid | 0.5 | 2.4 | PGMEA | Δ | <10 |
| Comp. Ex. 63 | BSTFA | 7.8 | 30.2 | iOx | liquid | 0.2 | 2.4 | PGMEA | ◎ | 19 |
| Comp. Ex. 64 | TMS-DMA | 3.5 | 30.2 | Im | solid | 0.2 | 2.4 | PGMEA | ○ | 75 |
| Comp. Ex. 65 | HMDS | 4.8 | 30.2 | Im | solid | 0.2 | 2.4 | PGMEA | ○ | 67 |
| Comp. Ex. 66 | TMS-Im | 4.2 | 30.2 | Im | solid | 0.2 | 2.4 | PGMEA | ○ | 74 |
| Comp. Ex. 67 | TDACP | 4.8 | 30.2 | Im | solid | 0.2 | 2.4 | PGMEA | ○ | 77 |
| Comp. Ex. 68 | HMCTS | 6.6 | 30.2 | Im | solid | 0.2 | 2.4 | PGMEA | ○ | 70 |
| Comp. Ex. 69 | HMDS | 4.8 | 30.2 | Tet | solid | 0.2 | 2.4 | PGMEA | X | 90 |
| Comp. Ex. 70 | HMDS | 4.8 | 30.2 | 5-MeTet | solid | 0.2 | 2.4 | PGMEA | X | 88 |
| Comp. Ex. 71 | HMDS | 4.8 | 30.2 | Tri | solid | 0.2 | 2.4 | PGMEA | X | 65 |
| Comp. Ex. 72 | HMDS | 4.8 | 30.2 | BzoTri | solid | 0.3 | 2.4 | PGMEA | Δ | 66 |
| Comp. Ex. 73 | HMDS | 4.8 | 30.2 | Pyr | solid | 0.2 | 2.4 | PGMEA | Δ | 49 |
| Comp. Ex. 74 | HMDS | 4.8 | 30.2 | 2-MeIm | solid | 0.2 | 2.4 | PGMEA | X | 66 |
| Comp. Ex. 75 | HMDS | 4.8 | 30.2 | 4-MeIm | solid | 0.2 | 2.4 | PGMEA | Δ | 75 |
| Comp. Ex. 76 | HMDS | 4.8 | 30.2 | TFAcIm | liquid | 0.4 | 2.4 | PGMEA | ◎ | 79 |
| Comp. Ex. 77 | HMDS | 4.8 | 30.2 | 3-Mer-1,2,4-Tri | solid | 0.3 | 2.4 | PGMEA | Δ | 77 |
| Comp. Ex. 78 | HMDS | 4.8 | 30.2 | 5-MeBzoTri | solid | 0.3 | 2.4 | PGMEA | Δ | 73 |
| Comp. Ex. 79 | HMDS | 4.8 | 30.2 | 5-AminoTet | solid | 0.2 | 2.4 | PGMEA | X | 82 |
| Comp. Ex. 80 | HMDS | 4.8 | 30.2 | Tet-1-AcOH | solid | 0.3 | 2.4 | PGMEA | X | 53 |
| Comp. Ex. 81 | HMDS | 4.8 | 30.2 | Tet-5-AcOH | solid | 0.3 | 2.4 | PGMEA | X | 89 |
| Comp. Ex. 82 | HMDS | 4.8 | 30.2 | 5-Mer-1-MeTet | solid | 0.3 | 2.4 | PGMEA | X | 84 |
| Comp. Ex. 83 | HMDS | 4.8 | 30.2 | 5-BnTet | solid | 0.4 | 2.4 | PGMEA | Δ | 90 |
| Comp. Ex. 84 | HMDS | 4.8 | 30.2 | 5-PhTet | solid | 0.4 | 2.4 | PGMEA | X | 87 |
| Comp. Ex. 85 | HMDS | 4.8 | 30.2 | 5-pTolTet | solid | 0.4 | 2.4 | PGMEA | X | 85 |
| Comp. Ex. 86 | HMDS | 4.8 | 30.2 | 5-Mer-1-PhTet | solid | 0.4 | 2.4 | PGMEA | X | 86 |
| Comp. Ex. 87 | HMDS | 4.8 | 30.2 | 5-MeThiTet | solid | 0.3 | 2.4 | PGMEA | X | 90 |
| Comp. Ex. 88 | HMDS | 4.8 | 30.2 | Sac | solid | 0.5 | 2.4 | PGMEA | X | 86 |
| Comp. Ex. 89 | HMDS | 4.8 | 30.2 | iOx | liquid | 0.2 | 2.4 | PGMEA | ◎ | 32 |

Examples 2 to 19 and Comparative Examples 1 to 89

The surface treatment of wafers was performed in the same manner as in Example 1 except that the kinds and mass % concentrations of the components (I) and (II) as the raw materials of the surface treatment agent were changed as shown in TABLES 1 and 2. The surface-treated wafers were evaluated in the same manner as above.

In the respective tables, the term "N-MeIm" refers to N-methylimidazole (available from Tokyo Chemical Industry Co., Ltd.); the term "N-EtIm" refers to N-ethylimidazole (available from Tokyo Chemical Industry Co., Ltd.); the term "N-BuIm" refers to N-butylimidazole (available from Tokyo Chemical Industry Co., Ltd.); term "DBN" refers to 1,5-diazabicyclo[4.3.0]-5-nonene (available from Tokyo Chemical Industry Co., Ltd.); the term "DBU" refers to 1,8-diazabicyclo[5.4.0]-7-undecene (available from Tokyo Chemical Industry Co., Ltd.); the term "MTBD" refers to 7-methyl-1,5,7-triazabicyclo[4.4.0]dec-5-ene (available from Tokyo Chemical Industry Co., Ltd.); the term "TMS-Im" refers to N-trimethylsilylimidazole (available from Tokyo Chemical Industry Co., Ltd.); the term "TMS-TFA" refers to trimethylsilyltrifluoroacetate (($CH_3$)$_3$Si—OC(=O)CF$_3$; available from Tokyo Chemical Industry Co., Ltd.); the term "BSTFA" refers to N,O-bis(trimethylsilyl)trifluoroacetamide (($CH_3$)$_3$SiOC(CF$_3$)=NSi($CH_3$)$_3$; available from Tokyo Chemical Industry Co., Ltd.); the term "Tet" refers to 1H-tetrazole (available from Tokyo Chemical Industry Co., Ltd.); the term "5-MeTet" refers to 5-methyltetrazole (available from Tokyo Chemical Industry Co., Ltd.); the term "Tri" refers to 1,2,4-triazole (available from Tokyo Chemical Industry Co., Ltd.); the term "BzoTri" refers to 1,2,3-benzotriazole (available from Tokyo Chemical Industry Co., Ltd.); the term "Pyr" refers to pyrazole (available from Tokyo Chemical Industry Co., Ltd.); the term "2-MeIm" refers to 2-methylimidazole (available from Tokyo Chemical Industry Co., Ltd.); the term "4-MeIm" refers to 4-methylimidazole (available from Tokyo Chemical Industry Co., Ltd.); the term "TFAcIm" refers to 1-(trifluoroacetyl)imidazole (available from Tokyo Chemical Industry Co., Ltd.); the term "3-Mer-1,2,4-Tri" refers to 3-mercapto-1,2,4-triazole (available from Tokyo Chemical Industry Co., Ltd.); the term "5-MeBzoTri" refers to 5-methyl-H-benzotriazole (available from Tokyo Chemical Industry Co., Ltd.); the term "5-AminoTet" refers to 5-amino-1H-tetrazole (available from Tokyo Chemical Industry Co., Ltd.); the term "Tet-1-AcOH" refers to 1H-tetrazole-1-acetic acid (available from Tokyo Chemical Industry Co., Ltd.); the term "Tet-5-AcOH" refers to 1H-tetrazole-5-acetic acid (available from Tokyo Chemical Industry Co., Ltd.); the term "5-Mer-1-MeTet" refers to 5-mercapto-1-methyltetrazole (available from Tokyo Chemical Industry Co., Ltd.); the term "5-BnTet" refers to 5-benzyl-1H-tetrazole (available from Tokyo Chemical Industry Co., Ltd.); the term "5-PhTet" refers to 5-phenyltetrazole (available from Tokyo Chemical Industry Co., Ltd.); the term "5-pTolTet" refers to 5-(p-tolyl)-1H-tetrazole (available from Tokyo Chemical Industry Co., Ltd.); the term "5-Mer-1-PhTet" refers to 5-mercapto-1-phenyl-1H-tetrazole (available from Tokyo Chemical Industry Co., Ltd.); the term "5-MeThiTet" refers to 5-(methylthio)-1H-tetrazole (available from Sigma-Aldrich Co. LLC.); the term "Sac" refers to o-sulfonebenzimide (saccharin; available from Tokyo Chemical Industry Co., Ltd.); the term "iOx" refers to isoxazole (available from Tokyo Chemical Industry Co., Ltd.); the term "TMS-DMA" refers to N-(trimethylsilyl)dimethylamine (available from Tokyo Chemical Industry Co., Ltd.); the term "HMDS" refers to 1,1,1,3,3,3-hexamethyldisilazane (available from Tokyo Chemical Industry Co., Ltd.); the term "TDACP" refers to 2,2,5,5-tetramethyl-2,5-disila-1-azacyclopentane (available from Gelest Co., Ltd.); and the term "HMCTS" refers to 2,2,4,4,6,6-hexamethylcyclotrisilazane (available from Tokyo Chemical Industry Co., Ltd.).

In each of Examples 1 to 19, the dissolution time during the preparation of the surface treatment agent was short within 30 seconds; and, with the thus-prepared surface treatment agent, good water repellency was imparted to the surface of the workpiece (wafer).

In Comparative Examples 1 to 63 in each of which the component (II) of the surface treatment agent was different from that of the surface treatment agent according to the present disclosure, the insoluble component was not dissolved unless the raw material mixture was kept stirred for more than 30 seconds (see Comparative Examples 1, 2, 4, 6, 7, 9, 10, 12 to 16, 18 to 20, 22, 23, 25, 27, 28, 30, 31, 33, 35 to 37, 39 to 41, 43 to 46, 48, 49, 52, 54, 56 to 58 and 60 to 62); the insoluble component remaining without being dissolved was visually observed even after 1 hour of stirring of the raw material mixture (see Comparative Examples 3, 11, 17, 24, 32, 34, 38, 51, 53, 55 and 59); or the water repellency imparting effect was poor even though the dissolution time was short within 30 seconds (see Comparative Examples 5, 8, 21, 26, 29, 42, 47, 50 and 63). The surface treatment agents of these Comparative Examples were inferior to the surface treatment agent according to the present disclosure.

In Comparative Examples 64 to 68 (corresponding to Examples 1 to 9, 22 and 23 of Japanese Laid-Open Patent Publication No. 2017-063179) in each of which the component (I) of the surface treatment agent was different from that of the surface treatment agent according to the present disclosure, the water repellency imparting effect was poor even though the dissolution time was short within 30 seconds (see Comparative Examples 64 to 68). The surface treatment agents of these Comparative Examples were also inferior to the surface treatment agent according to the present disclosure.

In Comparative Examples 69 to 89 (respectively corresponding to Examples 15, 16, 19 to 21, 34, 35 and 38 to 51 of Japanese Laid-Open Patent Publication No. 2017-063179) in each of which both of the components (I) and (II) of the surface treatment agent were different from those of the surface treatment agent according to the present disclosure, the raw material was not dissolved unless the raw material mixture was kept stirred for more than 30 seconds (see Comparative Examples 72, 73, 75, 77, 78 and 83); the insoluble component remaining without being dissolved was visually observed even after 1 hour of stirring of the raw material mixture (see Comparative Examples 69 to 71, 74, 79 to 81 and 84 to 88); or the water repellency imparting effect was poor even through the dissolution time was short (see Comparative Examples 76 and 89). The surface treatment agents of these Comparative Examples were also inferior to the surface treatment agent according to the present disclosure.

In Examples 2 to 8 (Examples 10 to 16) in which any of N-MeIm, N-EtIm, N-BuIm, DBN, DBU, MTBD and TMS-Im, each liquid at 25° C. and 1 atmospheric pressure, was used as the component (II) of the surface treatment agent, the dissolution time was very short within 5 seconds as compared to Example 1 (Example 9) in which Im, solid at 25° C. and 1 atmospheric pressure, was used as the component (II) of the surface treatment agent. Thus, the surface treatment agents of Examples 2 to 8 (Examples 10 to 16) were superior in terms of the shortening of the dissolution time of the raw materials.

Further, it has been shown by the above results that, in terms of the water repellency imparting effect, it is preferable to use at least one selected from the group consisting of DBN, DBU, MTBD, N-MeIm, N-EtIm and N-BuIm as the component (II) (see Examples 2 to 7 and 13 to 15); and it is more preferable to use at least one selected from the group consisting of DBN, DBU and MTBD as the component (II) (see Examples 5 to 7 and 13 to 15).

Furthermore, the surface treatment agents of Examples 17 to 19 in which: BSTFA was used as the component (I); and DBN, DBU or MTBD was used as the component (II) were superior in terms of the water repellency imparting effect and the shortening of the dissolution time of the raw materials.

Example A-1

(1) Preparation of Surface Treatment Agent

Raw materials of a surface treatment agent, that is, N-trimethylsilyltrifluoroacetamide ($(CH_3)_3SiN(H)C(=O)CF_3$; available from Karl Bucher GmbH; hereinafter also referred to as "TMS-TFAcA") as the component (I): silicon compound (I-1), TMS-TFA as the component (I): silicon compound (I-2), Im as the component (II) and PGMA as the component (III) were mixed at concentrations shown in TABLE 3 while the temperature of the resulting liquid mixture was maintained at 25° C. As the whole raw materials were dissolved by stirring for about 15 seconds, there was obtained the surface treatment agent in solution form.

(2) Evaluation of Contact Angle Retention Rate after Surface Treatment.

Utilizing the above-prepared surface treatment agent, the cleaning and surface treatment of a silicon wafer was performed in the same manner as in Example 1. Then, the evaluation test was conducted according to the procedure mentioned in the above section (B). As shown in TABLE 3, the contact angle after the surface treatment was 88°. Thus, the surface treatment agent had a good water repellency imparting effect. The contact angle evaluation result after the surface treatment was regarded as a reference contact angle under no water addition (water addition amount: 0.00 mass %).

Next, 0.01 mass % or 0.02 mass % of water was added to the surface treatment agent based on the total amount of the surface treatment agent. The surface treatment agent was stirred at 25° C. for 1 minute. Utilizing the thus-obtained surface treatment agent, the surface treatment of a silicon wafer was performed in the same manner as above. After that, the contact angle after the surface treatment was evaluated. The evaluated contact angle was shown in TABLE 3 and FIG. 1 as a relative value (i.e. contact angle retention rate after surface treatment), with the reference contact angle being defined as 100.

TABLE 3

| | | Composition of Surface Treatment Agent | | | | | | |
|---|---|---|---|---|---|---|---|---|
| | | (I) | | | (II) | | | |
| | Raw Material for Component (I) | Kind | Concentration of Component (I) Based on Total Amount of Components (I) to (III) [mass %] | [mmol/ 100 g] | Kind | Form at 25° C. and 1 atm. | Concentration of Component (II) Based on Total Amount of Components (I) to (III) [mass %] | [mmol/ 100 g] | (III) Organic Solvent |
| Ex. A-1 | TMS-TFA TMS-TFAcA | TMS-TFA TMS-TFAcA | 2.8 2.8 | 15.1 15.1 | Im | solid | 0.2 | 2.4 | PGMEA |
| Ex. A-2 | HMDS TFAA | TMS-TFA TMS-TFAcA | 2.8 2.8 | 15.1 15.1 | Im | solid | 0.2 | 2.4 | PGMEA |
| Ex. 9 | TMS-TFA | TMS-TFA | 5.6 | 30.2 | Im | solid | 0.2 | 2.4 | PGMEA |
| Ex. A-3 | TMS-TFA TMS-TFAcA | TMS-TFA TMS-TFAcA | 2.8 2.8 | 15.1 15.1 | N-MeIm | liquid | 0.2 | 2.4 | PGMEA |
| Ex. A-4 | HMDS TFAA | TMS-TFA TMS-TFAcA | 2.8 2.8 | 15.1 15.1 | N-MeIm | liquid | 0.2 | 2.4 | PGMEA |
| Ex. 10 | TMS-TFA | TMS-TFA | 5.6 | 30.2 | N-MeIm | liquid | 0.2 | 2.4 | PGMEA |
| Ex. A-5 | TMS-TFA TMS-TFAcA | TMS-TFA TMS-TFAcA | 2.8 2.8 | 15.1 15.1 | DBN | liquid | 0.3 | 2.4 | PGMEA |
| Ex. A-6 | HMDS TFAA | TMS-TFA TMS-TFAcA | 2.8 2.8 | 15.1 15.1 | DBN | liquid | 0.3 | 2.4 | PGMEA |
| Ex. 13 | TMS-TFA | TMS-TFA | 5.6 | 30.2 | DBN | liquid | 0.3 | 2.4 | PGMEA |

| | Evaluation Results | | | |
|---|---|---|---|---|
| | | | Contact Angle Retention Rate (%) | |
| | (A) Dissolution Time | (B) Contact Angle [°] | Water Addition Amount 0.00 mass % | Water Addition Amount 0.01 mass % | Water Addition Amount 0.02 mass % |
| Ex. A-1 | ○ | 88 | 100 | 100 | 99 |
| Ex. A-2 | ○ | 89 | 100 | 101 | 101 |
| Ex. 9 | ○ | 88 | 100 | 92 | 65 |
| Ex. A-3 | ◉ | 87 | 100 | 100 | 99 |
| Ex. A-4 | ◉ | 89 | 100 | 101 | 101 |
| Ex. 10 | ◉ | 87 | 100 | 92 | 66 |
| Ex. A-5 | ◉ | 96 | 100 | 100 | 99 |
| Ex. A-6 | ◉ | 97 | 100 | 100 | 99 |
| Ex. 13 | ◉ | 96 | 100 | 93 | 63 |

Example A-2

(1) Preparation of Surface Treatment Agent

HMDS and trifluoroacetic anhydride ($CF_3C(=O)$—O—$C(=O)CF_3$; available from Tokyo Chemical Industry Co., Ltd.; hereinafter also referred to as "TFAA") as raw materials of the component (I), Im as the component (I) and PGMEA as the component (III) were mixed while the temperature of the resulting liquid mixture was maintained at 25° C. As shown in the following reaction scheme, HMDS and TFAA were reacted to form TMS-TFAcA as the silicon compound (I-1) and TMS-TFA as the silicon compound (I-2). As a result, there was obtained a surface treatment agent in which TMS-TFAcA as the silicon compound (I-1), TMS-TFA as the silicon compound (I-2), Im as the component (II) and PGMEA as the component (III) were contained at concentrations shown in TABLE 3. As the whole raw materials were dissolved by stirring for about 15 seconds, the surface treatment agent was obtained in solution form.

$(CH_3)_3Si$—$N(H)$—$Si(CH_3)_3 + CF_3C(=O)$—O—$C(=O)CF_3 \rightarrow (CH_3)_3SiN(H)C(=O)CF_3 + (CH_3)_3SOC(=O)CF_3$ (2) Evaluation of Contact Angle Retention Rate after Surface Treatment The evaluation of the contact angle retention rate after surface treatment was conducted in the same manner as in Example A-1. The evaluation results are shown in TABLE 3 and FIG. 1.

For reference purposes, the evaluation of the contact angle retention rate after surface treatment was conducted, in the same manner as in Example A-1, utilizing the surface treatment agent of Example 9 in which only TMS-TMA was used as the component (I), that is, the silicon compounds (I-1) and (I-2) were not used in combination. The evaluation results are shown in TABLE 3 and FIG. 1.

It has been shown by the the evaluation results of the above Examples that it is preferable that the surface treatment agent according to the present disclosure contains at least one kind of silicon compound (I-1) represented by the general formula [1] where a is 3; $R^2$ is a hydrogen atom; and $R^3$ is a fluorine-containing alkyl group of 1 to 6 carbon atoms and at least one kind of silicon compound (I-2) represented by the general formula [2] where c is 3; and $R^5$ is a fluorine-containing alkyl group of 1 to 6 carbon atoms as the component [I] due to the fact that, in the case where the surface treatment agent was of such a composition, the water repellency imparting effect of the surface treatment agent on the surface of the workpiece was easily and stably maintained even when water was mixed into the surface treatment agent.

Examples A-3, A-4 and 10

Figure 2:
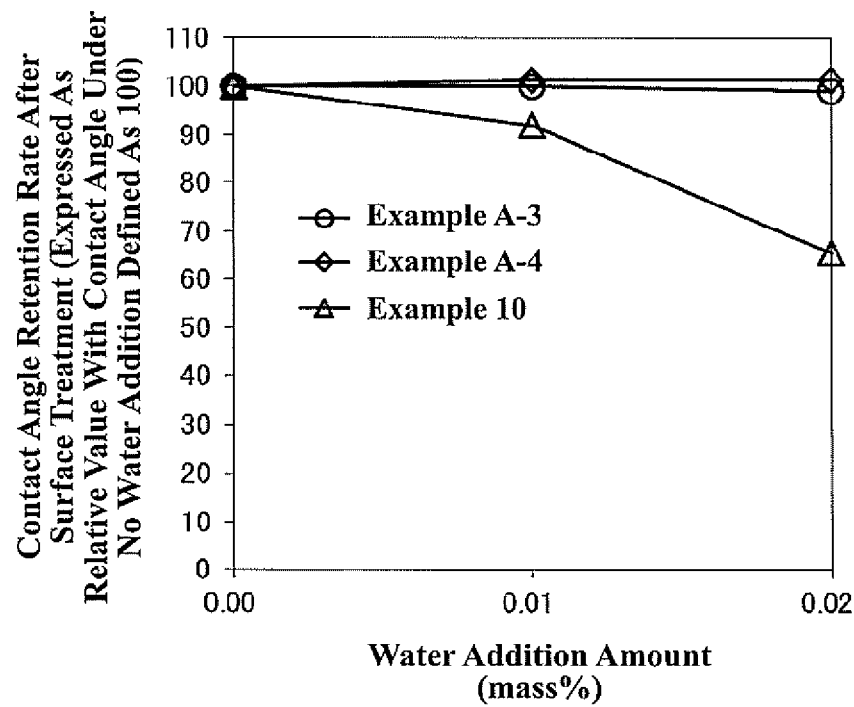
FIG. 2 is a plot of the contact angle retention rate after surface treatment (Examples A-3, A-4 and 10) relative to the water addition amount.

The preparation of surface treatment agents were conducted in the same manner as in Examples A-1 and A-2, respectively, except that N-MeIm was used as the component (II). Utilizing the thus-prepared surface treatment agent, the evaluation of the contact angle retention rate after surface treatment was conducted in the same manner as above. For reference purposes, the evaluation of the contact angle retention rate after surface treatment was conducted, in the same manner as in Example A-1, utilizing the surface treatment agent of Example 10 in which only TMS-TMA was used as the component (I), that is, the silicon compounds (I-1) and (I-2) were not used in combination. The evaluation results are shown in TABLE 3 and FIG. 2.

Examples A-5, A-6 and 13

Figure 3:
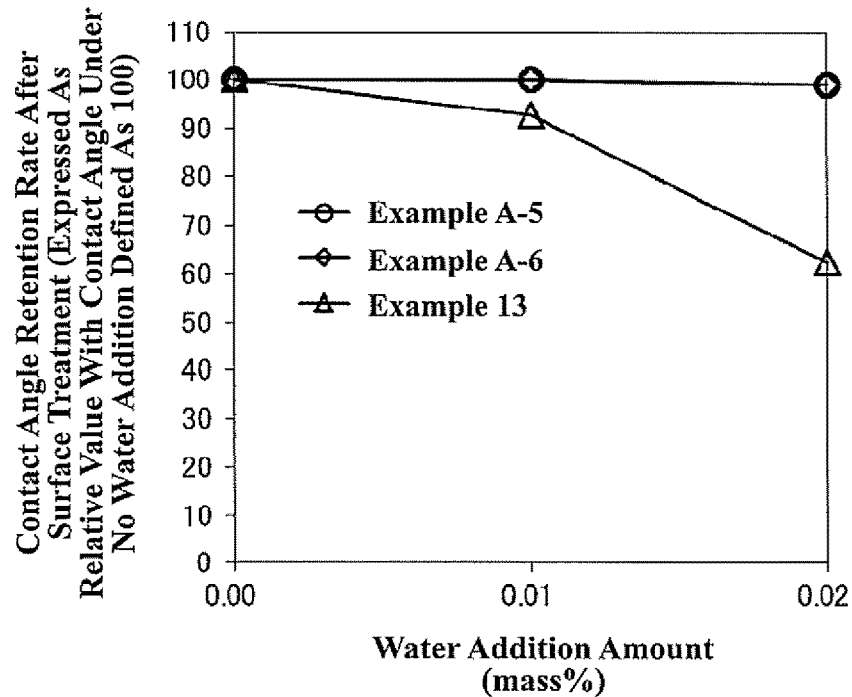
FIG. 3 is a plot of the contact angle retention rate after surface treatment (Examples A-5, A-6 and 13) relative to the water addition amount.

The preparation of surface treatment agents were conducted in the same manner as in Examples A-1 and A-2, respectively, except that DBN was used as the component (II). Utilizing the thus-prepared surface treatment agent, the evaluation of the contact angle retention rate after surface treatment was conducted in the same manner as above. For reference purposes, the evaluation of the contact angle retention rate after surface treatment was conducted, in the same manner as in Example A-1, utilizing the surface treatment agent of Example 13 in which only TMS-TMA was used as the component (I), that is, the silicon compounds (I-1) and (I-2) were not used in combination. The evaluation results are shown in TABLE 3 and FIG. 3.

As shown by the evaluation results of the above Examples, the water repellency imparting effect on the surface of the workpiece was easily and stably maintained even when water was mixed into the surface treatment agent, irrespective of whether the kind of the component (II) was changed, in the case where the surface treatment agent contained at least one kind of silicon compound (I-1) represented by the general formula [1] where a was 3; $R^2$ was hydrogen; and $R^3$ was fluorine-containing alkyl of 1 to 6 carbon atoms and at least one kind of silicon compound (I-2) represented by the general formula [2] where c was 3; and $R^5$ was a fluorine-containing alkyl group of 1 to 6 carbon atoms as the component (I).

Examples 2-1 and 2-2

The surface treatment of wafers was performed in the same manner as in Example 2 except that the concentration of the component (I) based on the total amount of the components (I) to (III) was changed to 15.0 mmol/100 g or 97.4 mmol/100 g as shown in TABLE 4. Then, the evaluation test was conducted in the same manner as above. The evaluation results are shown in TABLE 4 and FIG. 4.

TABLE 4

| | Composition of Surface Treatment Agent | | | | | | | | Evaluation Results | |
|---|---|---|---|---|---|---|---|---|---|---|
| | (I) | | | | (II) | | | | | |
| | | Concentration of Component (I) Based on Total Amount of Components (I) to (III) | | | | Concentration of Component (II) Based on Total Amount of Components (I) to (III) | | | | (B) |
| | Kind | [mass %] | [mmol/ 100 g] | Kind | Form at 25° C. and 1 atm. | [mass %] | [mmol/ 100 g] | Organic Solvent | (A) Dissolution Time | Contact Angle [°] |
| Ex. 2 | MSTFA | 6.0 | 30.2 | N-MeIm | liquid | 0.2 | 2.4 | PGMEA | ◎ | 94 |
| Ex. 2-1 | | | | | | 1.2 | 15.0 | PGMEA | ◎ | 97 |
| Ex. 2-2 | | | | | | 8.0 | 97.4 | PGMEA | ◎ | 99 |

TABLE 4-continued

| | | Composition of Surface Treatment Agent | | | | | | Evaluation Results | |
|---|---|---|---|---|---|---|---|---|---|
| | | (I) | | (II) | | | | | |
| | | Concentration of Component (I) Based on Total Amount of Components (I) to (III) | | | Concentration of Component (II) Based on Total Amount of Components (I) to (III) | | | | |
| | | | | | | | (III) | (A) | (B) |
| | Kind | [mass %] | [mmol/ 100 g] | Kind | Form at 25° C. and 1 atm. | [mass %] | [mmol/ 100 g] | Organic Solvent | Dissolution Time | Contact Angle [°] |
| Ex. 5 | MSTFA | 6.0 | 30.2 | DBN | liquid | 0.3 | 2.4 | PGMEA | ◎ | 93 |
| Ex. 5-1 | | | | | | 1.9 | 15.0 | PGMEA | ◎ | 96 |
| Ex. 5-2 | | | | | | 12.1 | 97.4 | PGMEA | ◎ | 98 |
| Comp. Ex. 6 | MSTFA | 6.0 | 30.2 | 2-MeIm | solid | 0.2 | 2.4 | PGMEA | Δ | 72 |
| Comp. Ex. 6-1 | | | | | | 1.2 | 15.0 | PGMEA | Δ | 79 |
| Comp. Ex. 6-2 | | | | | | 8.0 | 97.4 | PGMEA | X | 78 |
| Comp. Ex. 7 | MSTFA | 6.0 | 30.2 | 4-MeIm | solid | 0.2 | 2.4 | PGMEA | Δ | 85 |
| Comp. Ex. 7-1 | | | | | | 1.2 | 15.0 | PGMEA | Δ | 89 |
| Comp. Ex. 7-2 | | | | | | 8.0 | 97.4 | PGMEA | Δ | 84 |

Examples 5-1 and 5-2

The surface treatment of wafers was performed in the same manner as in Example 5 except that the concentration of the component (II) based on the total amount of the components (I) to (III) was changed to 15.0 mmol/100 g or 97.4 mmol/100 g as shown in TABLE 4. Then, the evaluation test was conducted in the same manner as above.

Figure 4:
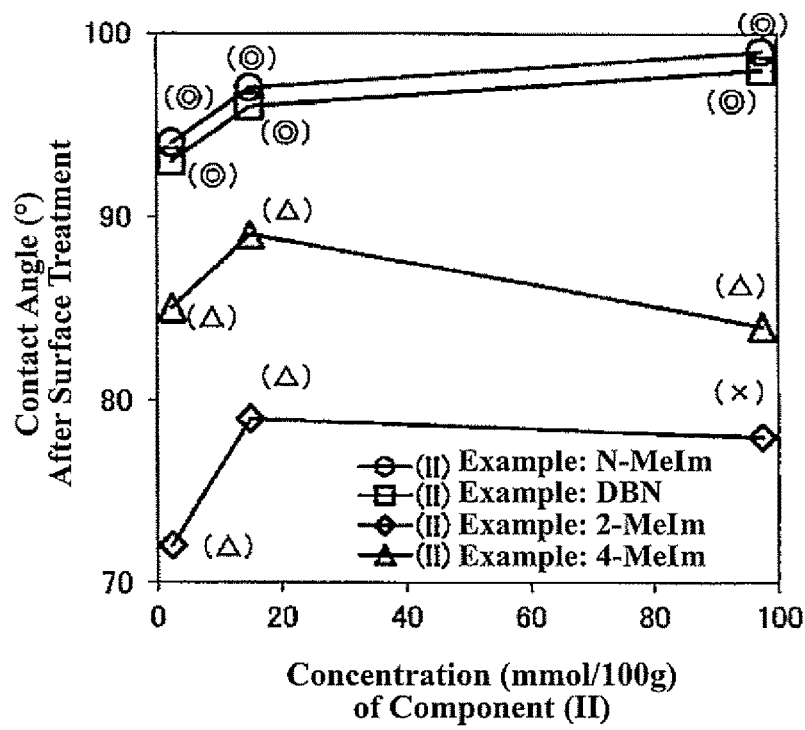
FIG. 4 is a diagram showing a plot of the contact angle after surface treatment and a trend of the dissolution time (PGMEA solvent) relative to the concentration of the component (II).

The evaluation results are shown in TABLE 4 and FIG. 4.

Comparative Examples 6-1 and 6-2

The surface treatment of wafers was performed in the same manner as in Comparative Example 6 except that the concentration of the component (II) based on the total amount of the components (I) to (III) was changed to 15.0 mmol/100 g or 97.4 mmol/100 gas shown in TABLE 4. Then, the evaluation test was conducted in the same manner as above. The evaluation results are shown in TABLE 4 and FIG. 4.

Comparative Examples 7-1 and 7-2

The surface treatment of wafers was performed in the same manner as in Comparative Example 7 except that the concentration of the component (II) based on the total amount of the components (I) to (III) was changed to 15.0 mmol/100 g or 97.4 mmol/100 gas shown in TABLE 4. Then, the evaluation test was conducted in the same manner as above. The evaluation results are shown in TABLE 4 and FIG. 4.

In Examples 2, 2-1 and 2-1 in which N-Melm was used as the component (II), there was seen a tendency that the contact angle was improved to 94°, 970 and 99° as the concentration of the component (II) was increased to 2.4 mmol/100 g, 15.0 mmol/100 g and 97.4 mmol/100 g based on the total amount of the components (I) to (III). Irrespective of such increase of the concentration of the component (II), the dissolution time was at a favorable level of ◎ in each of these Examples. Herein, the respective dissolution time evaluation results are indicated inside the parentheses in the vicinities of the plot points in FIG. 4.

Similarly, there was seen a tendency in Examples 5, 5-1 and 5-2 in which DBN was used as the component (II) that the contact angle was improved to 93°, 960 and 98° as the concentration of the component (II) was increased to 2.4 mmol/100 g, 15.0 mmol/100 g and 97.4 mmol/100 g based on the total amount of the components (I) to (III). Irrespective of such increase of the concentration of the component (II), the dissolution time was at a favorable level of ◎ in each of these examples.

In Comparative Examples 6, 6-1 and 6-2 in which 2-Melm was used as the component (II), there was seen a tendency that the contact angle was improved to 72°, 79 and 780 as the concentration of the component (II) was increased to 2.4 mmol/100 g, 15.0 mmol/100 g and 97.4 mmol/100 g based on the total amount of the components (I) to (III). However, the dissolution time evolution results were Δ, Δ and X. There was seen a tendency that the dissolution time was deteriorated with increase of the concentration of the component (II) in these Comparative Examples.

Even in Comparative Examples 7, 7-1 and 7-2 in which 4-Melm was uses as the component (II), the dissolution time evaluation results were Δ (dissolution time: about 3 minutes), Δ (dissolution time: about 10 minutes) and Δ (dissolution time: about 30 minutes), respectively, although there was seen a tendency that the contact angle was slightly improved to 85°, 890 and 840 as the concentration of the component (II) was increased to 2.4 mmol/100 g, 15.0 mmol/100 g and 97.4 mmol/100 g based on the total amount of the components (I) to (III).

It has been confirmed from the above results that the surface treatment agent according to the present disclosure exerts a good water repellency imparting effect over a wide range of the concentration of the component (II) based on the total amount of the components (I) to (III), and, during the preparation of the surface treatment agent, the raw material components can be dissolved in a short time. Accordingly, it is possible to freely select the concentration of the component (II) in the surface treatment agent according to the present disclosure. The concentration of the component (II) can suitably be set to 0.05 mass % or higher in terms of the reaction promoting effect (and, by extension, the water repellency imparting effect) and to 10.0 mass % or lower in terms of the less likelihood of surface erosion of the workpiece and the less likelihood of impurity residue on the surface of the workpiece.

On the other hand, it has been confirmed that, in the case where the nitrogen-containing heterocyclic compound which does not correspond to the component (II) of the present disclosure is used, the dissolution rate is inferior and deteriorated with increase of the concentration of the nitrogen-containing heterocyclic compound.

Examples 2D, 2D-1 and 2D-2

Figure 5:
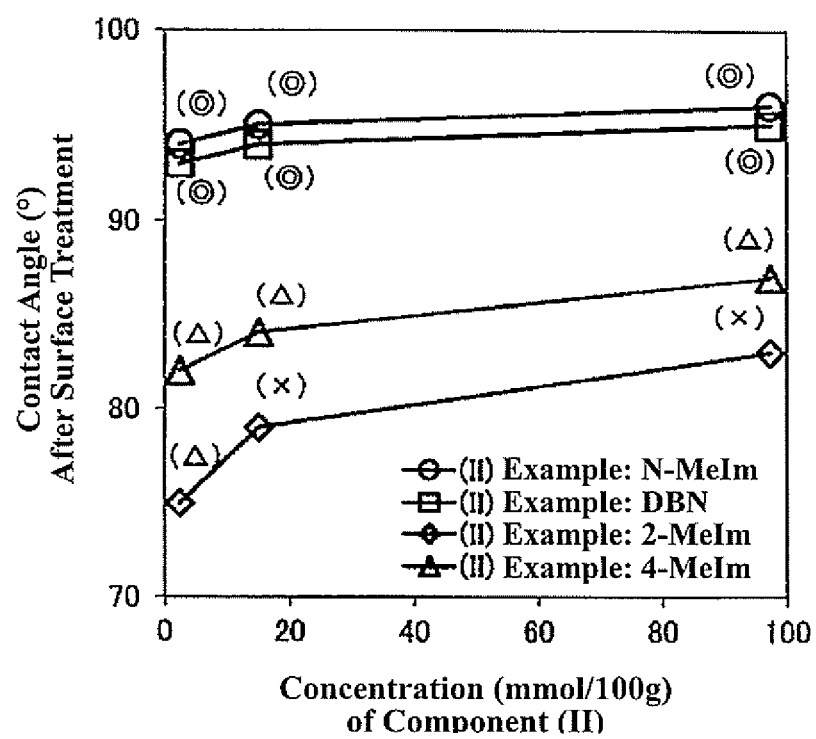
FIG. 5 is a diagram showing a plot of the contact angle after surface treatment and a trend of the dissolution time (n-decane/TPGDME mixed solvent) relative to the concentration of the component (II).

The surface treatment of wafers was respectively performed in the same manner as in Examples 2, 2-1 and 2-2 except that the organic solvent was changed to n-Decane/TPGDME-43 as shown in TABLE 5. Then, the evaluation result was conducted in the same manner as above. The evaluation results are shown in TABLE 5 and FIG. 5. Herein, the term "n-Decane/TPGDME-43" refers to a mixed solvent of n-decane (available from Tokyo Chemical Industry Co., Ltd.) and tripropylene glycol dimethyl ether (available from Tokyo Chemical Industry Co., Ltd.; hereinafter also referred to as "TPGDME") where the concentration of TPGM was 43 mass % based on the total amount of the components (I) to (III).

evaluation result was conducted in the same manner as above. The evaluation results are shown in TABLE 5 and FIG. 5.

Comparative Examples 7D, 7D-1 and 7D-2

The surface treatment of wafers was respectively performed in the same manner as in Examples 7, 7-1 and 7-2 except that the organic solvent was changed to n-Decane/TPGDME-43 as shown in TABLE 5. Then, the evaluation result was conducted in the same manner as above. The evaluation results are shown in TABLE 5 and FIG. 5.

In Examples 2D, 2D-1 and 2D-2 in which N-MeIm was used as the component (II), there was seen a tendency that the contact angle was improved to 94°, 950 and 960 as the concentration of the component (II) was increased to 2.4 mmol/100 g, 15.0 mmol/100 g and 97.4 mmol/100 g based on the total amount of the components (I) to (III). Irrespective of such increase of the concentration of the component (II), the dissolution time was at a favorable level of ⊚ in each of these examples. Herein, the respective dissolution time evaluation results are indicated inside the parentheses in the vicinities of the plot points in FIG. 5.

In Examples 5D, 5D-1 and 5D-2 in which DBN was used as the component (II), there was seen a tendency that the

TABLE 5

| | | Composition of Surface Treatment Agent | | | | | | | | |
|---|---|---|---|---|---|---|---|---|---|---|
| | | (I) | | | | (II) | | | | |
| | | | Concentration of Component (I) Based on Total Amount of Components (I) to (III) | | | | Concentration of Component (II) Based on Total Amount of Components (I) to (III) | | | Evaluation Results |
| | Kind | [mass %] | [mmol/ 100 g] | Kind | Form at 25° C. and 1 atm. | [mass %] | [mmol/ 100 g] | (III) Organic Solvent | (A) Dissolution Time | (B) Contact Angle [°] |
| Ex. 2D | MSTFA | 6.0 | 30.2 | N-MeIm | liquid | 0.2 | 2.4 | n-Decane/TPGDME-43 | ⊚ | 94 |
| Ex. 2D-1 | | | | | | 1.2 | 15.0 | n-Decane/TPGDME-43 | ⊚ | 95 |
| Ex. 2D-2 | | | | | | 8.0 | 97.4 | n-Decane/TPGDME-43 | ⊚ | 96 |
| Ex. 5D | MSTFA | 6.0 | 30.2 | DBN | liquid | 0.3 | 2.4 | n-Decane/TPGDME-43 | ⊚ | 93 |
| Ex. 5D-1 | | | | | | 1.9 | 15.0 | n-Decane/TPGDME-43 | ⊚ | 94 |
| Ex. 5D-2 | | | | | | 12.1 | 97.4 | n-Decane/TPGDME-43 | ⊚ | 95 |
| Comp. Ex. 6D | MSTFA | 6.0 | 30.2 | 2-MeIm | solid | 0.2 | 2.4 | n-Decane/TPGDME-43 | Δ | 75 |
| Comp. Ex. 6D-1 | | | | | | 1.2 | 15.0 | n-Decane/TPGDME-43 | X | 79 |
| Comp. Ex. 6D-2 | | | | | | 8.0 | 97.4 | n-Decane/TPGDME-43 | X | 83 |
| Comp. Ex. 7D | MSTFA | 6.0 | 30.2 | 4-MeIm | solid | 0.2 | 2.4 | n-Decane/TPGDME-43 | Δ | 82 |
| Comp. Ex. 7D-1 | | | | | | 1.2 | 15.0 | n-Decane/TPGDME-43 | Δ | 84 |
| Comp. Ex. 7D-2 | | | | | | 8.0 | 97.4 | n-Decane/TPGDME-43 | Δ | 87 |

Examples 5D, 5D-1 and 5D-2

The surface treatment of wafers was respectively performed in the same manner as in Examples 5, 5-1 and 5-2 except that the organic solvent was changed to n-Decane/TPGDME-43 as shown in TABLE 5. Then, the evaluation result was conducted in the same manner as above. The evaluation results are shown in TABLE 5 and FIG. 5.

Comparative Examples 6D, 6D-1 and 6D-2

The surface treatment of wafers was respectively performed in the same manner as in Comparative Examples 6, 6-1 and 6-2 except that the organic solvent was changed to n-Decane/TPGDME-43 as shown in TABLE 5. Then, the contact angle was improved to 93°, 940 and 95° as the concentration of the component (II) was increased to 2.4 mmol/100 g, 15.0 mmol/100 g and 97.4 mmol/100 g based on the total amount of the components (I) to (III). Further, the dissolution time was at a favorable level of ⊚ in each of these examples irrespective of such increase of the concentration of the component (II).

In Comparative Examples 6D, 6D-1 and 6D-2 in which 2-MeIm was used as the component (II), there was seen a tendency that the contact angle was improved to 75°, 790 and 830 as the concentration of the component (II) was increased to 2.4 mmol/100 g, 15.0 mmol/100 g and 97.4 mmol/100 g based on the total amount of the components (I) to (III). However, the dissolution time evolution results were Δ, X and X in these Comparative Examples. There was seen a tendency that the dissolution time was deteriorated with increase of the concentration of the component (II).

Even in Comparative Examples 7D, 7D-1 and 7D-2 in which 4-MeIm was used as the component (II), the dissolution time evaluation results were Δ (dissolution time: about 5 minutes), Δ (dissolution time: about 15 minutes) and A (dissolution time: about 50 minutes), respectively, although there was seen a tendency that the contact angle was improved to 82°, 840 and 870 as the concentration of the component (II) was increased to 2.4 mmol/100 g, 15.0 mmol/100 g and 97.4 mmol/100 g based on the total amount of the components (I) to (III).

In Comparative Examples 7D, 7D-1 and 7D-2 in which "Decane/TPGDME-43" containing nonpolar n-decane solvent was used as the organic solvent, the dissolution time was longer than that in the above-mentioned Comparative Examples 7, 7-1 and 7-2 in which PGMEA was used as the organic solvent. It has been shown by these results that it is preferable that the content of the nonpolar solvent in the organic solvent is as low as possible in terms of the solubility of the components (I) and (II). The above-mentioned tendency was also seen in the other Examples and Comparative Examples.

It has been confirmed that, when the "Decane/TPGDME-43" containing nonpolar n-decane solvent is used as the organic solvent, the dissolution rate is also inferior and deteriorated with increase of the concentration of the nitrogen-containing heterocyclic compound in the case where the nitrogen-containing heterocyclic compound which does not correspond to the component (II) of the present disclosure is used.

On the other hand, it has been confirmed that, even when "Decane/TPGDME-43" containing nonpolar n-decane solvent is used as the organic solvent, the surface treatment agent according to the present disclosure exerts a good water repellency imparting effect over a wide range of the concentration of the component (II) based on the total amount of the components (I) to (III) and, during the preparation of the surface treatment agent, the raw material components can be dissolved in a short time. It is accordingly possible to freely select the concentration of the component (II) in the surface treatment agent according to the present disclosure. The concentration of the component (II) can suitably be set to 0.05 mass % or higher in terms of the reaction promoting effect (and, by extension, the water repellency imparting effect) and to 10.0 mass % or lower in terms of the less likelihood of surface erosion of the workpiece and the less likelihood of impurity residue on the surface of the workpiece.

As described above, the surface treatment agent according to the present disclosure is advantageous in that: the surface treatment agent exerts a good water repellency imparting effect; and, during preparation of the surface treatment agent, the raw materials are dissolved in a short time.

The invention claimed is:

1. A surface treatment agent for surface treatment of a workpiece, comprising the following components:
(I) at least one compound selected from the group consisting of silicon compounds represented by the following general formulas [1], [2] and [3];
(II) at least one compound selected from the group consisting of a nitrogen-containing heterocyclic compound represented by the following general formula [4], a nitrogen-containing heterocyclic compound represented by the following general formula [5], and imidazole; and
(III) an organic solvent $$(R^1)_a(H)_b Si[N(R^2)C(=O)R^3]_{4-a-b} \qquad [1]$$

where $R^1$ is each independently a monovalent hydrocarbon group of 1 to 18 carbon atoms in which a part or all of hydrogen atoms may be substituted with a fluorine atom; $R^2$ is each independently a group selected from the group consisting of an alkyl group of 1 to 6 carbon atoms in which a part or all of hydrogen atoms may be substituted with a fluorine atom, and a hydrogen atom; $R^3$ is each independently an alkyl group of 1 to 6 carbon atoms in which a part or all of hydrogen atoms may be substituted with a fluorine atom; a is an integer of 1 to 3; b is an integer of 0 to 2; and the sum of a and b is 1 to 3, $$(R^4)_c(H)_d Si[OC(=O)R^5]_{4-c-d} \qquad [2]$$

where $R^4$ is each independently a monovalent hydrocarbon group of 1 to 18 carbon atoms in which a part or all of hydrogen atoms may be substituted with a fluorine atom; $R^5$ is each independently an alkyl group of 1 to 6 carbon atoms in which a part or all of hydrogen atoms may be substituted with a fluorine atom; c is an integer of 1 to 3; d is an integer of 0 to 2; and the sum of c and d is 1 to 3, $$(R^6)_e(H)_f Si[OC(R^7)=NSi(R^8)_g(H)_{3-g}]_{4-e-f} \qquad [3]$$

where $R^6$ and $R^8$ are each independently a monovalent hydrocarbon group of 1 to 18 carbon atoms in which a part or all of hydrogen atoms may be substituted with a fluorine atom; $R^7$ is each independently a group selected from the group consisting of an alkyl group of 1 to 6 carbon atoms in which a part or all of hydrogen atoms may be substituted with a fluorine atom, and a hydrogen atom; e is an integer of 1 to 3; f is an integer of 0 to 2; g is an integer of 1 to 3; and the sum of e and f is 1 to 3,

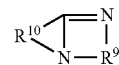

[4]

where $R^9$ and $R^{10}$ are each independently a divalent organic group consisting of carbon and/or nitrogen and hydrogen; the total number of carbon and nitrogen atoms in the divalent organic group is 1 to 9; and, when the total number of carbon and nitrogen atoms in the divalent organic group is 2 or more, there may be present any carbon atom without constituting a cyclic structure, and

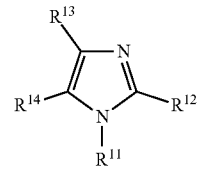

[5]

where $R^{11}$ is an alkyl group of 1 to 6 carbon atoms in which a part or all of hydrogen atoms may be substituted with a fluorine atom, an alkenyl group of 2 to 6 carbon atoms in which a part or all of hydrogen atoms may be substituted with a fluorine atom, an alkoxy group of 1 to 6 carbon atoms in which a part or all of hydrogen atoms may be substituted with a fluorine atom, an amino group, an alkylamino group having an alkyl group of 1 to 6 carbon atoms in which a part or all of hydrogen atoms may be substituted with a fluorine atom, a dialkylamino group having an alkyl group of 1 to 6 carbon atoms in which a part or all of hydrogen atoms may be substituted with a fluorine atom, an aminoalkyl group of 1 to 6 carbon atoms in which a part or all of hydrogen atoms may be substituted with a fluorine atom, a nitro group, a cyano group, a phenyl group, a benzyl group, or a halogen atom; $R^{12}$, $R^{13}$ and $R^{14}$ are each independently an alkyl group of 1 to 6 carbon atoms in which a part or all of hydrogen atoms may be substituted with a fluorine atom, or a hydrogen atom.

2. The surface treatment agent according to claim 1, wherein the concentration of the component (II) is 0.05 to 10 mass % based on the total amount of the components (I) to (III).

3. The surface treatment agent according to claim 1, wherein the component (II) is liquid at 25° C. and 1 atmospheric pressure.

4. The surface treatment agent according to claim 1, wherein, in the general formula [5], $R^{11}$ is an alkyl of 1 to 4 carbon atoms, and $R^{12}$, $R^{13}$ and $R^{14}$ are hydrogen atoms.

5. The surface treatment agent according to claim 1, wherein the component (II) is at least one selected from the group consisting of 1,5-diazabicyclo[4.3.0]-5-nonene, 1,8-diazabicyclo[5.4.0]-7-undecene, 7-methyl-1,5,7-triazabicyclo[4.4.0]dec-5-ene, N-methylimidazole, N-ethylimidazole, N-propylimidazole, N-butylimidazole.

6. The surface treatment agent according to claim 1, wherein the concentration of the component (I) is 0.1 to 35 mass % based on the total amount of the components (I) to (III).

7. The surface treatment agent according to claim 1, wherein the surface treatment agent contains, as the component (I), at least one kind of silicon compound represented by the general formula [1] where a is 3; $R^2$ is a methyl group; and $R^3$ is a fluorine-containing alkyl group of 1 to 6 carbon atoms.

8. The surface treatment agent according to claim 1, wherein $(CH_3)_3SiN(CH_3)C(=O)CF_3$ is contained as the component (I).

9. The surface treatment agent according to claim 1,
wherein the silicon compound represented by the general formula [2] is contained as the component (I), and
wherein the component (II) is at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene.

10. The surface treatment agent according to claim 1, wherein the surface treatment agent contains, as the component (I), at least one kind of silicon compound represented by the general formula [2] where c is 3; and $R^5$ is a fluorine-containing alkyl group of 1 to 6 carbon atoms.

11. The surface treatment agent according to claim 10, wherein the component (II) is at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene.

12. The surface treatment agent according to claim 1, wherein $(CH_3)_3SiOC(=O)CF_3$ is contained as the component (I).

13. The surface treatment agent according to claim 12, wherein the concentration of $(CH_3)_3SiOC(=O)CF_3$ is 1 to 20 mass % based on the total amount of the components (I) to (III).

14. The surface treatment agent according to claim 1, wherein the surface treatment agent contains, as the component (I), at least one kind of silicon compound (I-1) represented by the general formula [1] where a is 3; $R^2$ is a hydrogen atom; and $R^3$ is a fluorine-containing alkyl group of 1 to 6 carbon atoms, and at least one kind of silicon compound (I-2) represented by the general formula [2] where c is 3; and $R^5$ is a fluorine-containing alkyl group of 1 to 6 carbon atoms.

15. The surface treatment agent according to claim 14,
wherein the silicon compound (I-1) is $(CH_3)_3SiN(H)C(=O)CF_3$, and
wherein the silicon compound (I-2) is $(CH_3)_3SiOC(=O)CF_3$.

16. The surface treatment agent according to claim 1, wherein the surface treatment agent contains, as the component (I), at least one kind of silicon compound represented by the general formula [3] where e and g are 3; and $R^7$ is a methyl group or a trifluoromethyl group.

17. The surface treatment agent according to claim 1, wherein $(CH_3)_3SiOC(CF_3)=NSi(CH_3)_3$ is contained as the component (I).

18. The surface treatment agent according to claim 1,
wherein the silicon compound represented by the general formula [3] is contained as the component (I), and
wherein the component (II) is at least one selected from the group consisting of 1,5-diazabicyclo[4.3.0]-5-nonene, 1,8-diazabicyclo[5.4.0]-7-undecene and 7-methyl-1,5,7-triazabicyclo[4.4.0]dec-5-ene.

19. The surface treatment agent according to claim 1, wherein the organic solvent is an aprotic solvent.

20. A method of manufacturing a surface-treated body, comprising: treating a surface of a workpiece by bringing the surface treatment agent according to claim 1 into contact with the surface of the workpiece.

* * * * *